US006825615B2

(12) United States Patent
Shigeoka

(10) Patent No.: US 6,825,615 B2
(45) Date of Patent: Nov. 30, 2004

(54) LAMP HAVING A HIGH-REFLECTANCE FILM FOR IMPROVING DIRECTIVITY OF LIGHT AND HEAT TREATMENT APPARATUS HAVING SUCH A LAMP

(75) Inventor: Takashi Shigeoka, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 45 days.

(21) Appl. No.: 09/983,217

(22) Filed: Oct. 23, 2001

(65) Prior Publication Data

US 2002/0105275 A1 Aug. 8, 2002

(30) Foreign Application Priority Data

Oct. 24, 2000 (JP) ....................................... 2000-324214

(51) Int. Cl.[7] ................................................ H01L 21/31
(52) U.S. Cl. ........................ 313/635; 313/113; 392/422; 219/411
(58) Field of Search ................................ 313/113, 110, 313/21, 635, 318.02, 114; 392/422, 416, 420, 424, 421; 219/411; 362/255

(56) References Cited

U.S. PATENT DOCUMENTS 3,536,946 A * 10/1970 Kopelman et al. ............ 315/11
4,287,231 A * 9/1981 DeCaro et al. ............. 427/106
4,965,485 A * 10/1990 Tarumi et al. ................ 313/43
5,382,874 A * 1/1995 Johnson ...................... 313/578
5,536,991 A * 7/1996 Parham et al. .............. 313/113
5,689,613 A * 11/1997 Cherry ....................... 392/407
5,689,614 A * 11/1997 Gronet et al. ............... 392/416
5,853,615 A * 12/1998 Suhr ..................... 252/301.21
5,951,896 A * 9/1999 Mahawili .................... 219/411
6,121,579 A * 9/2000 Aoki et al. ................. 219/390
6,310,323 B1 * 10/2001 Mahawili et al. ........... 219/390
6,437,290 B1 * 8/2002 Shao et al. ................. 219/390
2002/0030047 A1 * 3/2002 Shao et al. ................. 219/390

FOREIGN PATENT DOCUMENTS

JP 6-93440 11/1994
JP 10144619 A * 5/1998 ........... H01L/21/26

* cited by examiner

*Primary Examiner*—Vip Patel
*Assistant Examiner*—Glenn Zimmerman
(74) *Attorney, Agent, or Firm*—Pillsbury Winthrop LLP

(57) ABSTRACT

A lamp for a heat treatment apparatus that provides a rapid temperature rise without using a reflector. The lamp has at least one electrode part to which an electric power is supplied. A light-emitting part, connected to the electrode part, seals a filament for emitting light. A high-reflectance film is formed on an outer surface of a first portion of the light-emitting part so as to reflect light emitted from the filament. Reflected light exits from the light-emitting part through a second portion not having a film formed thereon. Accordingly, directivity of light exiting from the second portion of the light-emitting part is improved.

8 Claims, 39 Drawing Sheets

LAMP HAVING A HIGH-REFLECTANCE FILM FOR IMPROVING DIRECTIVITY OF LIGHT AND HEAT TREATMENT APPARATUS HAVING SUCH A LAMP

BACKGROUND OF THE INVENTION

1. Field of the Invention

The present invention generally relates to heat treatment apparatuses and more particularly to a heat treatment apparatus which performs an anneal process or a chemical vapor deposition (CVD) process by heating an object to be processed, such as a single crystalline substrate or a glass substrate, with a lamp and a quartz window used for such a heat treatment apparatus. The present invention is suitable for a rapid thermal processing (RTP: Rapid Thermal Processing) used for manufacturing semiconductor devices, such as a memory or an integrated circuit (IC). The rapid thermal processing (RTP) includes rapid thermal annealing (RTA), rapid thermal cleaning (RTC), rapid thermal chemical vapor deposition (RTCVD), rapid thermal oxidization (RTO) and rapid thermal nitriding (RTN).

2. Description of Related Art

Generally, in order to manufacture a semiconductor integrated circuit, various kinds of heat treatment, such as a film deposition process, an anneal process, an oxidization diffusion process, a sputtering process, an etching process and a nitriding processing may be repeatedly performed on a silicon substrate such as a semiconductor wafer a plurality of times.

Since yield rate and quality of semiconductor manufacturing processes can be improved, the RTP technology to rise and drop the temperature of the wafer (object to he processed) has attracted attention. A conventional RTP apparatus generally comprises: a single-wafer chamber (process chamber) for accommodating an object to be processed (for example, a semiconductor wafer, a glass substrate for photograph masks, a glass substrate for a liquid-crystal display or a substrate for optical discs); a reflector (reflective board) arranged at the opposite side of the object to be processed with respect to a quartz window arranged in the interior of the process chamber; and a heating lamp (for example, halogen lamp) arranged at an upper part or above the quartz window, and the lamp.

The reflector is made of aluminum, and gold plating is given to a reflective part thereof. A cooling mechanism such as a cooling pipe is provided so as to prevent temperature breakage of the reflector (for example, exfoliation of gold plating due to a high temperature). The cooling mechanism is provided so as to prevent the reflector from being an obstacle of cooling the object to be processed at the time of cooling. The rapid temperature rising demanded for the RTP technology is dependent on the directivity of the optical irradiation to the object to be processed and the power density of the lamp.

The quartz window may be in the shape of a board, or can be in the form of tube which can accommodate the object to be processed. When maintaining a negative pressure environment in the process chamber by evacuating gasses in the process chamber by a vacuum pump, a thickness of the quartz window is set to, for example, about 30 to 40 mm so as to maintain the pressure difference between the internal pressure and the atmospheric pressure. The quartz window may be formed in a curved shape having a reduced thickness so as to prevent generation of a thermal stress due to temperature difference generated by a temperature rise.

A plurality of halogen lamps are arranged so as to uniformly heat the object to be processed. The reflector reflects the infrared rays irradiated from the halogen lamps toward the object to be processed. The process chamber is typically provided with a gate valve on a sidewall thereof so as to carry in and out the object to be processed. Moreover, a gas supply nozzle, which introduces a process gas used for heat treatment, is connected to the sidewall of the process chamber.

The temperature of the object to be processed affects the quality of process such as, for example, a thickness of a film in a film deposition process, etc. For this reason, it is necessary to know the correct temperature of the object to be processed. In order to attain high-speed heating and high-speed cooling, a temperature measuring device which measures the temperature of the object to be processed is provided in the process chamber. The temperature measuring device may be constituted by a thermocouple. However, since it is necessary to bring the thermocouple into contact with the object to be processed, there is a possibility that the processed body is polluted with the metal which constitutes the thermocouple. Therefore, there is proposed a payro meter as a temperature measuring device which detects an infrared intensity emitted and computes a temperature of an object to be processed from the back side thereof based on the detected infrared intensity. The payro meter computes the temperature of the object to be processed by carrying out a temperature conversion by an emissivity of the object to be processed according to the following expression:

$$E_m(T)=\epsilon E_{BB}(T) \quad (1)$$

where, $E_{BB}(T)$ expresses a radiation intensity from a black body having the temperature T; $E_m(T)$ expresses a radiation intensity measured from the object to be processed having the temperature T; $\epsilon$ expresses a rate of radiation of the object to be processed.

In operation, the object to be processed is introduced into the process chamber through the gate valve. The peripheral portion of the object to be processed is supported by a holder. At the time of heat treatment, process gases such as nitrogen gas and oxygen gas, are introduced into the process chamber through the gas supply nozzle. On the other hand, the infrared ray irradiated from the halogen lamps is absorbed by the object to be processed, thereby, rising the temperature of the object to be processed.

Recently, a demand for a rapid temperature rise of RTP has been increased so as to achieve a high-quality process of an object to be processed and improve a throughput. For example, there is a demand for increasing a temperature rising rate from 90 degrees/sec to 250 degrees/sec. The temperature rising rate depends on a power density of a lamp and a directivity of light irradiation from the lamp to an object to be processed.

FIG. 1 is an illustration showing an arrangement of a single end lamp and a reflector. As shown in FIG. 1, the directivity with respect to the object to be processed arranged underneath the single end lamp 2 having only one electrode part 3 and the energy efficiency of the lamp 2 are maximized when a degree of an angle $\alpha$of inclination of a reflector 4 relative to the lamp 2 is set to 45 degrees. However, if the reflector 4 having an inclination angle of 45 degrees is provided around each of a plurality of lamps 2, the lamps cannot be arranged closed to each other, which causes a decrease in the power density. On the other hand, it is considered to achieve a rapid temperature rise as a whole by increasing the lamp density by setting the inclination angle greater than 45 degrees so as to set the inclination angle equal to or close to 90 degrees while sacrificing the directivity and energy efficiency. However, there also is a problem in that the lamp density is prevented from being increased due to need of a cooling mechanism such as a cooling pipe incorporated in the reflector 4 in a two-dimensional arrangement.

SUMMARY OF THE INVENTION

It is a general object of the present invention to provide an improved and useful lamp and heat treatment apparatus in which the above-mentioned problems are eliminated.

A more specific object of the present invention is to provide a lamp used as a heat source of a heat treatment apparatus which can perform a rapid temperature rise without use of a reflector arranged around the lamp.

In order to achieve the above-mentioned objects, there is provided according one aspect of the present invention a lamp usable as a heat source of a heat treatment apparatus for applying a heat treatment to an object to be processed, the lamp comprising: at least one electrode part to which an electric power is supplied; a light-emitting part connected to the electrode part, the light-emitting part sealing a filament emitting a light; and a high-reflectance film formed on an outer surface of a first part of the light-emitting part so that the high-reflectance film reflects the light emitted from the filament and the reflected light exits from the light-emitting part through a second part of the light-emitting part other than the first part on which the high-reflectance film is formed so as to improve a directivity of the light exiting from the second part of the light-emitting part.

Additionally, there is provided according to another aspect of the present invention a heat treatment apparatus having a process chamber in which a heat treatment is applied to an object to be processed and a plurality of lamps as a heat source for heating the object to be processed, wherein each of the lamps has the same structure as the above mentioned lamp.

The above-mentioned lamp and heat treatment apparatus according to the present invention improves the directivity of the light toward the object to be processed by providing the high-reflectance film on the light-emitting part without using a reflector arranged around each lamp. Additionally, the lamps can be arranged with a high density since there is no need to use a cooling mechanism which is provided in a reflector with a two-dimensional arrangement. Thus, the lamp and the heat treatment apparatus according to the present invention are suitable for a rapid thermal processing (RTP) apparatus.

The lamp according to the present invention may be of a single end type in which the electrode part is connected to one end of the light-emitting part having an elongated tubular shape, and the first part of the light-emitting part may extends in a longitudinal direction of the light-emitting part. Additionally, the light-emitting part may have a straight cylindrical shape having a closed one end as a bottom surface, and the high-reflectance film may be formed on an outer surface of the light-transmitting part other than the bottom surface so that the reflected light exits from the light-emitting part through the bottom part which is arranged to face the object to be processed.

Alternatively, the lamp according to the present invention may be of a double end type in which the electrode part is connected to each opposite end of the light-emitting part having an elongated tubular shape, and the second part of the light-emitting part may face the object to be processed so that the light reflected by the high-reflecting film is directed to the object to be processed.

In the lamp according to the present invention, it is preferable that an outer surface of the first part of the light-emitting part has unevenness so that the high-reflectance film is formed on the outer surface having the unevenness. Additionally, the high-reflectance firm may be formed by gold plating, and a thickness of the high-reflectance film may be about 10 $\mu$m. Further, the heat treatment apparatus according to the present invention may further comprise a cooling part for maintaining the first part of the light-emitting part at a temperature not exceeding 500° C.

Other objects, features and advantages of the present invention will become more apparent from the following detailed description when read in conjunction with the accompanying drawings.

DETAILED DESCRIPTION OF THE PREFERRED EMBODIMENTS

Figure 1:
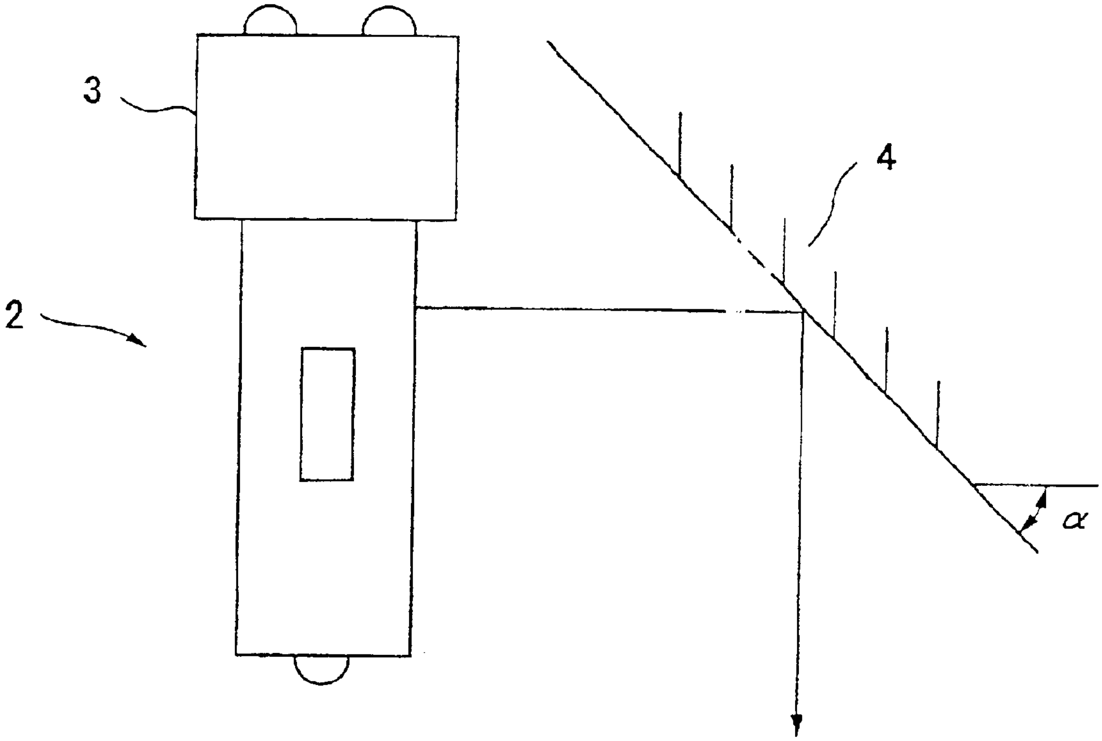
FIG. 1 PRIOR ART
FIG. 1 is an illustration showing an arrangement of a single end lamp and a reflector.
Figure 2:
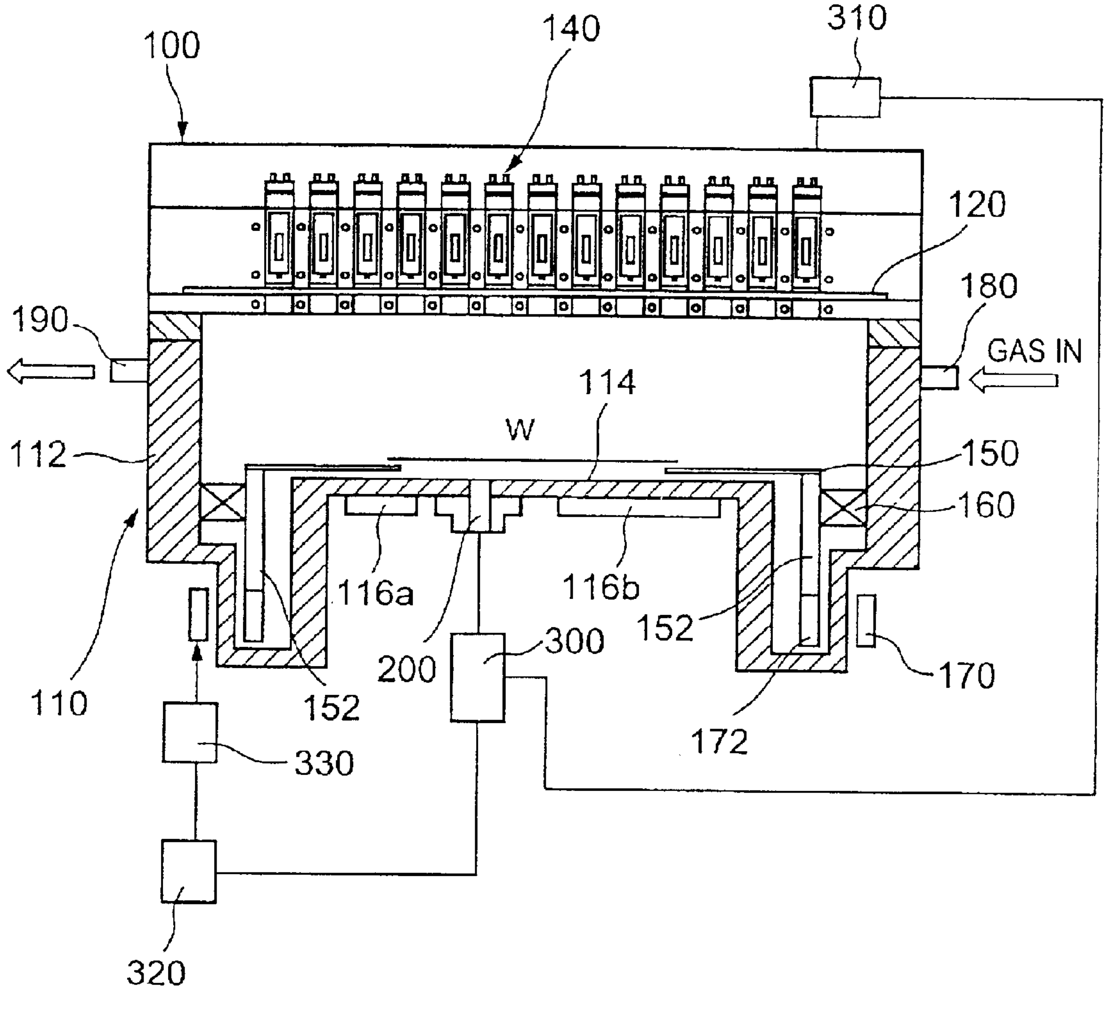
FIG. 2 is a cross-sectional view of a heat treatment apparatus according to a first embodiment of the present invention.

A description will now be given of a first embodiment of the present invention. FIG. 2 is a cross-sectional view of a heat treatment apparatus according to the first embodiment of the present invention.

As shown in FIG. 2, the heat treatment apparatus 100 generally comprises a process chamber 110, a quartz window (light-transmitting window) 120, a heating unit 140, a support ring 150, a gearing 160, a permanent magnet 170 a gas introducing part 180, an exhausting part 190, a radiation thermometer 200 and a control part 300.

The process chamber 110 is formed of stainless steel or aluminum. The quartz window 120 is connected to a top of the process chamber 110. The sidewall of the process chamber 110 and the quartz window 12 define a process space in which an object W to be processed (semiconductor wafer: hereinafter referred to as a wafer W) is subjected to a heat treatment. The support ring 150 on which the wafer W is placed and a support part 152 connected to the support ring 150 are arranged in the process space. The process space is maintained to be a predetermined negative pressure by the exhaust part 190. The wafer W is carried in or out from the process chamber through a gate valve (not shown in the figure) provided to the sidewall of the process chamber 110.

A bottom part 114 of the process chamber 110 is connected to a cooling pipes 116*a* and 116*b* (hereinafter simply referred to as cooling pipe 116) so that the bottom part 114 serves as a cooling plate. If necessary, the cooling plate 114 may be provided with a temperature control arrangement as shown in FIG. 2. The temperature control arrangement may comprise a control part 300, a temperature sensor and a beater. A cooling water is supplied to the temperature control arrangement from a water supply source such as a water line. A coolant such as alcohol, gulden or flon may be used instead of the cooling water. As for the temperature sensor, a known sensor such as a PTC thermister, an infrared sensor, a thermocouple, etc. may be used. The heater can be a line heater wound on the outer surface of cooling pipe 116. The temperature of the cooling water flowing through the cooling pipe 116 can be adjusted by controlling an electric current flowing through the line heater.

The quartz window 120 is attached to the process chamber in an airtight manner so as to maintain the negative pressure environment inside the process chamber 110 and transmit a heat radiation light emitted from lamps of the heating unit 140.

Figure 3:
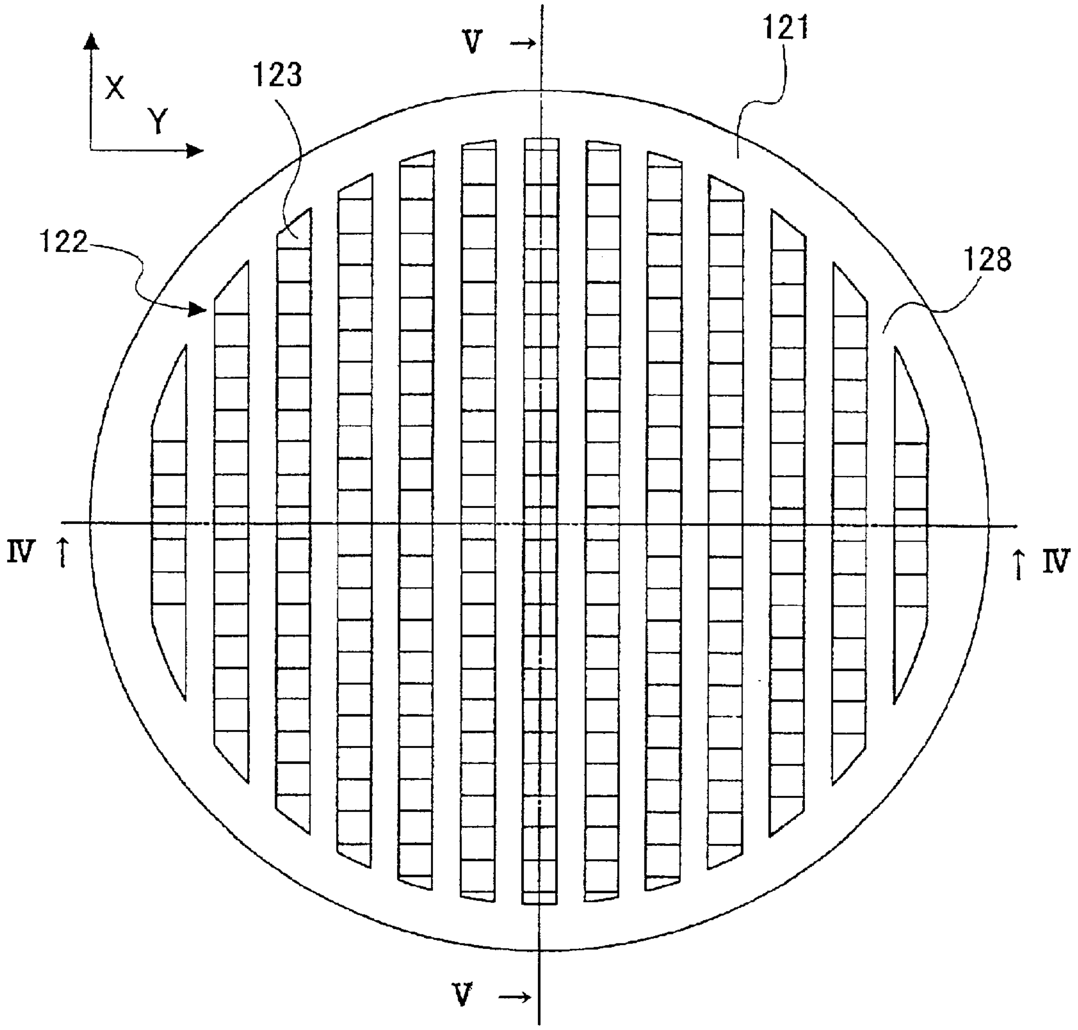
FIG. 3 is a plan view of a quartz window shown in FIG. 2.
Figure 4:
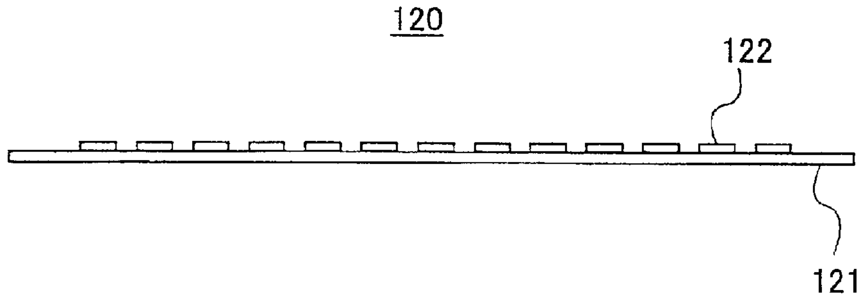
FIG. 4 is a cross-sectional view of the quartz window taken along a line IV—IV of FIG. 2.
Figure 5:
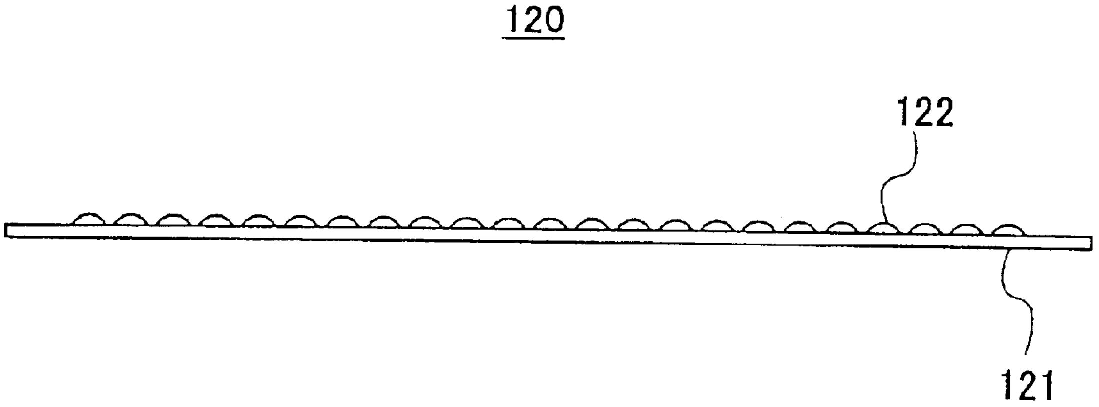
FIG. 5 is a cross-sectional view of the quartz window taken along a line V—V of FIG. 2.
Figure 6:
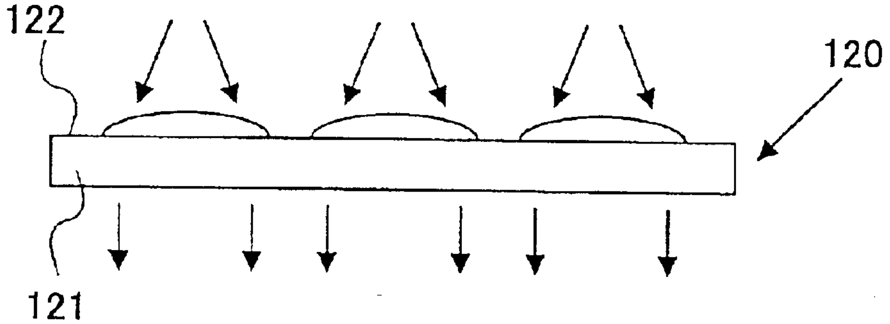
FIG. 6 is an enlarged cross-sectional view of a part of the quartz window shown in FIG. 5.
Figure 7:
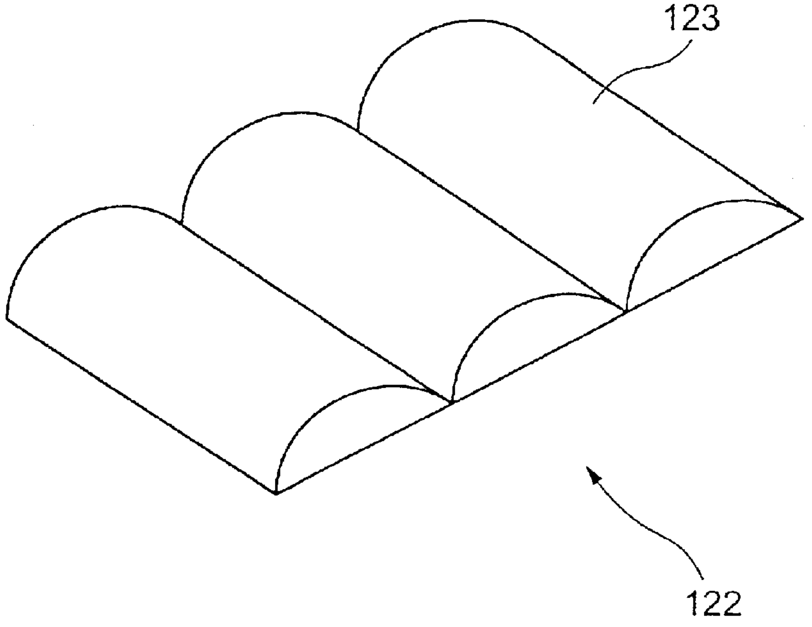
FIG. 7 is an enlarged perspective view of a part of a lens assembly used in the quartz window.

FIG. 3 is a plan view of the quartz window 120. FIG. 4 is a cross-sectional view of the quartz window taken along a line IV—IV of FIG. 3. FIG. 5 is a cross-sectional view of the quartz window taken along a line V—V of FIG. 3. FIG. 6 is an enlarged cross-sectional view of a part of the quartz window shown in FIG. 5. FIG. 7 is an enlarged perspective view of a part of a lens assembly used in the quartz window.

As shown in FIGS. 3 through 6, the quartz window 120 comprises a cylindrical quartz plate 121 having a radius of about 400 mm and a thickness of about 33 mm and a plurality of quartz lens assembly 122 comprising a plurality of lens elements 123.

The lens assembly 122 serves to strengthen the quartz window 120 and increase the directivity of the radiation light form the lamps of the heating unit 140. As shown in FIG. 3, each of the lens assemblies 122 has a plurality of lens elements 123 ach having a light converging action. The lens assemblies 122 are arranged parallel to the direction X since the lamps of the heating unit 140 are arranged in the direction X. That is, the direction of arrangement of the lens assemblies 122 is dependent on the direction of arrangement of the lamps of the heating unit 140.

In the present embodiment, although each of the lens elements 123 is curved in the direction X, the orientation of each of the lens elements 123 is not limited to that shown in the figure, and each of the lens elements 123 may be curved in the direction X, the direction Y or both the directions X and Y. In the present embodiment, the lens assemblies 122 are arranged so as to uniformly heat the entire wafer W having a circular shape.

The lens assemblies 122 serve to provide air passages AF (refer to FIGS. 32 and 34) for cooling the lens assemblies 122, the quartz window 120 and the lamps of the heating unit 140. Additionally, a gap between the adjacent lens assemblies 122 serves as a contact part 128 which contacts a separation wall 144 (described later) which cools the quartz plate 121 by heat conduction.

In the present embodiment, as described above, the thickness of the quartz plate 121 is set equal to or less than 30 mm to 40 mm, for example, about 30 mm. Although the present invention does not exclude the thickness being in the range of 30 mm to 40 mm so as to use only the light converging action of the lens assemblies 122, the use of the thin quartz plate 121 according to the present embodiment can provide an effect described later. Additionally, although the lens assemblies 122 according to the present embodiment has a height about 3 mm and a width equal to or less than 21 mm, the height and width are not limited to such dimensions. Further, although the lens elements 123 according to the present embodiment has a length about 18 mm and a radius about 10 mm, the length and radius are not limited to such dimensions.

In the present embodiment, although the window lens assemblies 122 are provided only on one side of the quartz plate 121 which side is opposite to the lamps 130 of the heating unit 140, the window lens assemblies 122 may be provided on both sides or on the other side which is not opposite to the lamps 130.

Since the strength with respect to thermal deformation of the quartz plate 121 is increased by the lens assemblies 122, there is no need to form the quartz plate 121 in a domal shape which curves in a direction protruding from the process chamber 110 as in the conventional apparatus. Accordingly, the quartz plate 121 has a flat shape. Since the quartz window formed in a domal shape increases a distance between the wafer W and the lamps 130 of the heating unit 140, there is a problem in that the directivity of the lamps is deteriorated. The present embodiment solves such a problem relating to the directivity of the lamps. Although the quartz plate 121 and the lens assemblies 122 are joined by welding in the present embodiment, the quartz plate 121 and the lens assemblies 122 may be joined by other methods or integrally formed with each other.

The thickness of the quartz plate 121 is about 30 mm, which is smaller than the thickness of the conventional quartz plate which ranges from 30 mm to 40 mm. Consequently, the quartz window 120 according to the present embodiment absorbs a smaller amount of the light emitted by the lamps 130 than the conventional quartz window. Thus, the quartz window 120 has the following advantages over the conventional quartz window.

First, a high rate temperature rise can be achieved with a low power consumption since the irradiation efficiency of the lamps 130 to the wafer W can be improved. That is, the present embodiment solves the problem in that the lamp light is absorbed by the quartz window which results in deterioration of the irradiation efficiency. Second, the quartz window is prevented from being damaged due to a difference in temperature between the front surface and the back surface of the quartz window 121 since the difference can be maintained smaller than that of the conventional quartz window. That is, the present embodiment solves the problem in that the conventional quartz window is easily destroyed due to a difference in the thermal stress between the front surface facing the lamps and the back surface opposite to the front surface when a rapid thermal process is performed as in a rapid thermal process (RTP) apparatus. Third, the quartz window is prevented from forming a deposition film or a byproduct on a surface thereof during a film deposition process since the temperature of the quartz window 120 is lower than the conventional quartz window. Thus, a good repeatability can be maintained and a frequency of cleaning operations applied to the process chamber 110 can be decreased. That is, the present embodiment solves the problem in that the temperature of the conventional window is high especially when a film deposition process is performed, which results in deposition of a deposition film or a byproduct on the surface of the quartz window and increase in the frequency of cleaning operations of the process chamber.

Additionally, although the quartz window 120 solely constituted by the quartz plate, which does not have the lens assemblies 122, may reduce an amount of light absorbed by the quartz plate 121 when the thickness of the quartz plate 121 is small as in the present embodiment, it is possible that the quartz window 120 is easily destroyed since the quartz plate 120 cannot withstand a pressure difference between the negative pressure in the process chamber and the atmospheric pressure. Accordingly, there is a problem in that the quartz window cannot be used with a process which must be performed under a negative pressure environment. The lens assemblies solve such a problem since the lens assemblies 122 reinforces the quartz plate 121.

Figure 42:
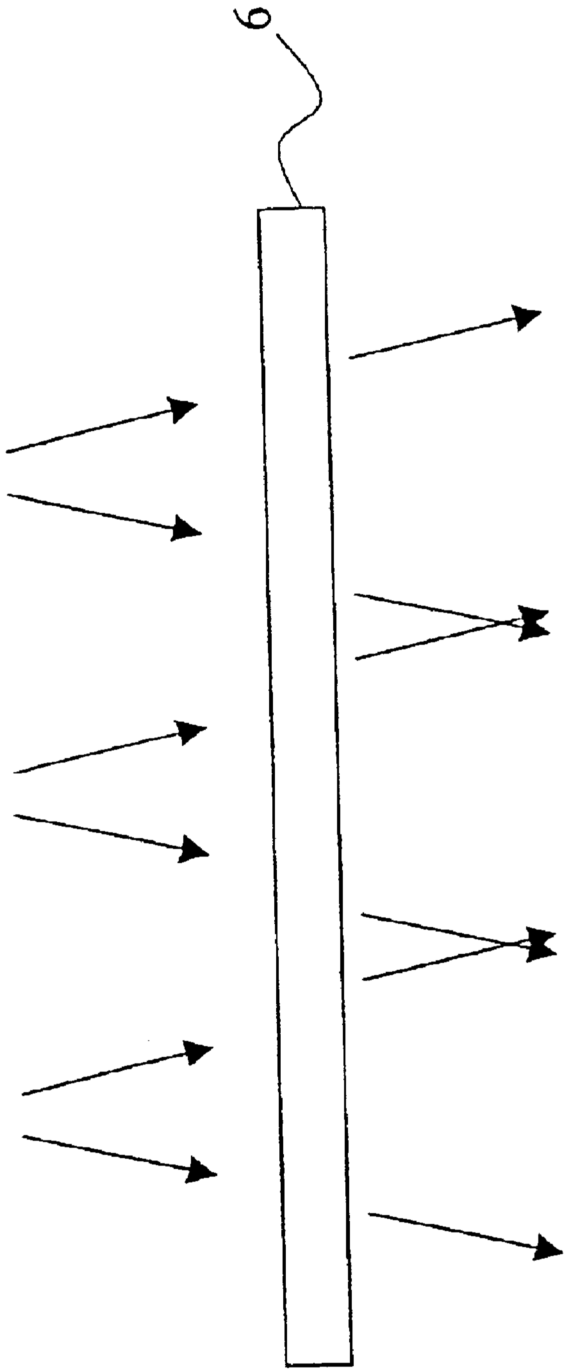
FIG. 42 is a cross-sectional view of a circular quartz window for explaining the directivity of the light passing through the circular quartz window.

A description will now be given, with reference to FIGS. 6, 7 and 42, of a light converging action of the lens assemblies 122 of the quartz window 120. FIG. 42 is a cross-sectional view of a conventional circular quartz window such as a light-transmitting window 6 for explaining the directivity of the light passing through the circular quartz window 6. Referring to FIG. 42, the light emitted from a single end lamp (not shown in the figure) positioned above the quartz window and transmitting the quartz window 6 is spread, and, thus, the directivity of the light passed through the quartz window 120 with respect to the wafer W, which is placed under the quartz window, is dull.

On the other hand, as shown in FIGS. 6 and 7, the quartz window 120 according to the present embodiment collimates the light emitted from the lamps 130 by the lens assemblies 122 having the convex lens elements 123 so that the light is irradiated on the wafer W with a good directivity. It should be noted that the structure of each lens element 123 is not limited to the specifically disclosed shape and curvature which collimate the light from the lamps 130, and the lens element may provide a directivity the same as the conventional quartz window. That is, even if the directivity is the same as that of the conventional quartz window, the lens assemblies 122 have the above-mentioned reinforcing function.

Figure 19:
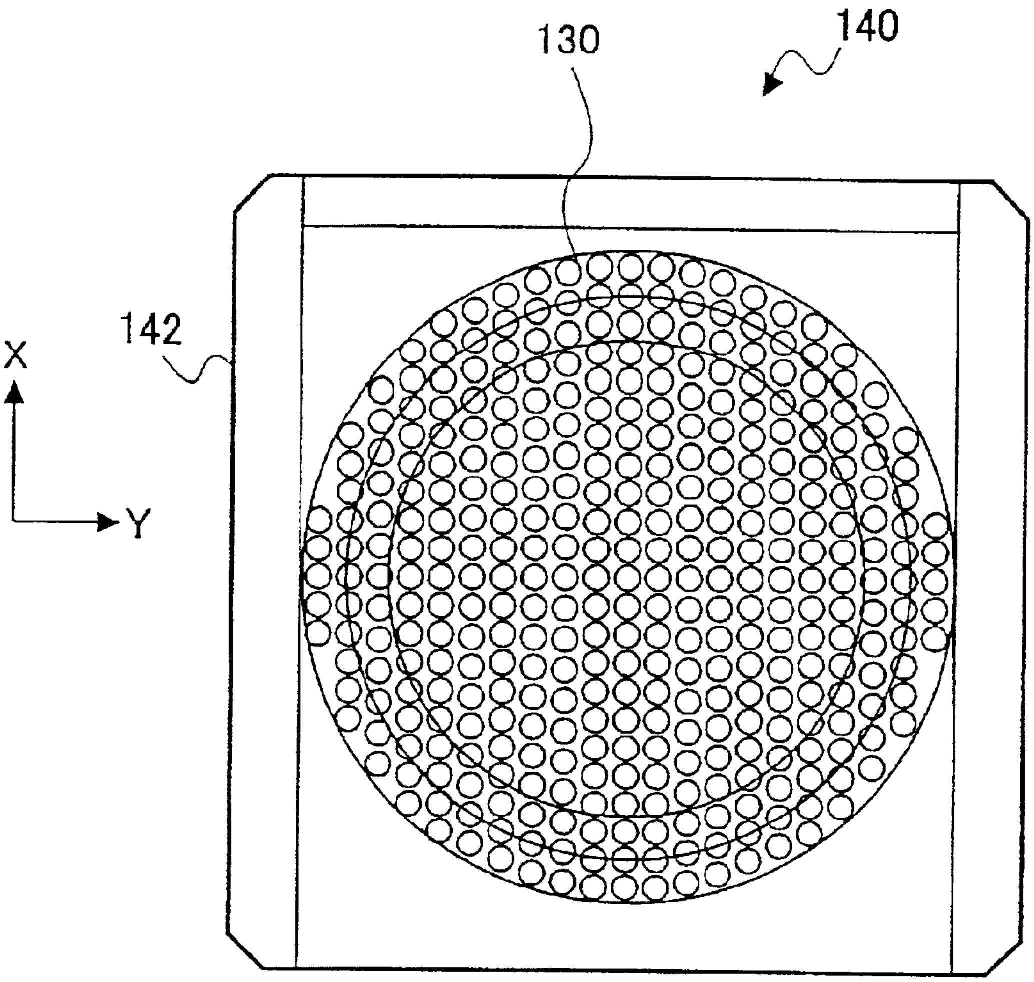
FIG. 19 is a plan view of a heating unit, which is a variation of the heating unit shown in FIG. 15.

A description will now be given, with reference to FIG. 8, of a quartz window 120A which is a variation of the quartz window according to the present embodiment. FIG. 19 is an enlarged cross-sectional view of a part of the quartz window 120A. The quartz window 120A has reinforcing members (or columns) 124, which are formed under the passage 128 and parallel to the passage 128. Each of the reinforcing members 124 is made of aluminum or stainless steel, and has a square cross section. The reinforcing members 124 have cooling pipes 125 therein, and increase a strength of the quartz window 120A.

The reinforcing members 124 have a good heat conductivity. Additionally, the reinforcing members 124 cannot be a source of pollution with respect to the wafer W since the reinforcing members 124 are formed of the same material as the process chamber. Due to the provision of the reinforcing members 124, the thickness of the quartz plate 121 can be 10 mm, preferably equal to or smaller than 7 mm, and, more preferably, about 5 mm.

Figure 12:
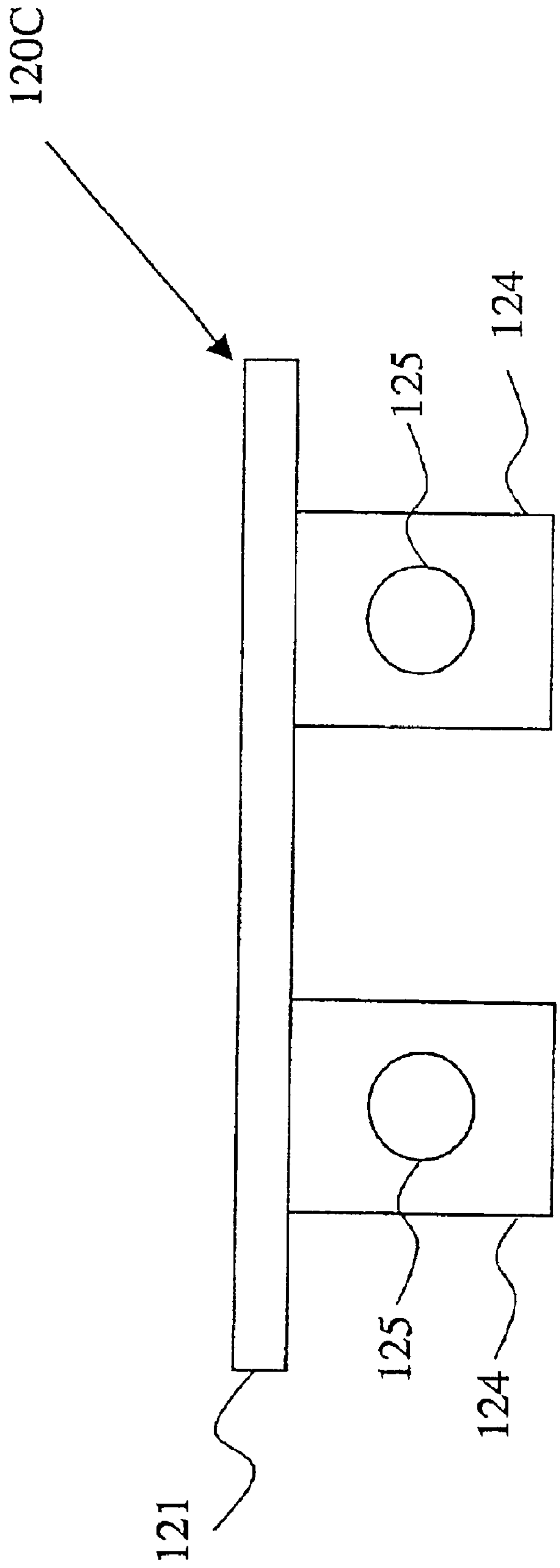
FIG. 12 is a side view of a part of a quartz window having reinforcing members.

In the present embodiment, the dimensions of the cross section of each reinforcing member 124 is 18 mm in height and about 12 mm in width. The diameter of the cooling pipe 125 is not limited to but about 6 mm. Additionally, the cross-section of each reinforcing member 124 is no limited to a square, and an arbitrary shape such as a wave shape may be used. The present invention encompasses a quarts window 120C which is a combination of the quartz plate 121 and the reinforcing members 124 as shown in FIG. 12.

Figure 8:
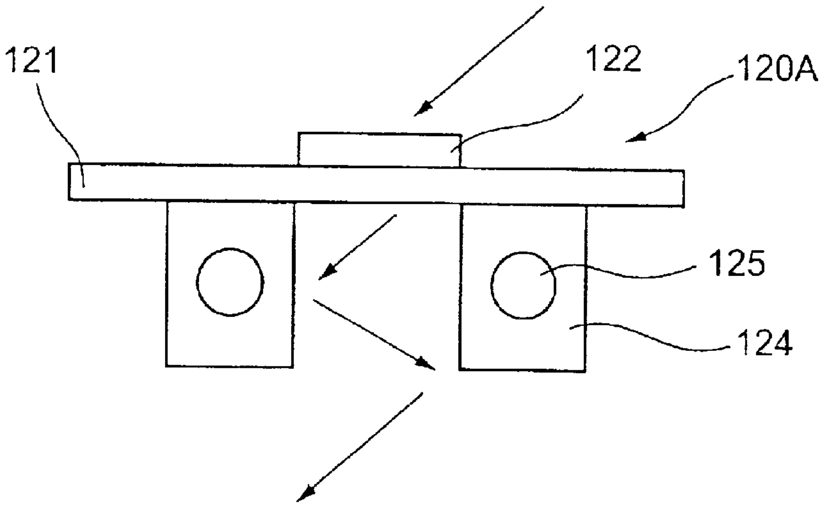
FIG. 8 is an enlarged cross-sectional view of a part of a quartz window, which is a variation of the quartz window shown in FIG. 2.

As shown by arrows in FIG. 8, the radiation light from the lamps 130 is reflected by sidewalls of reinforcing members 124, and reaches the wafer W placed under the quartz window. The cooling pipe 125 has a cooling function which cools both the reinforcing members 124 and the quartz plate 121. If the reinforcing members 124 are made of aluminum, an appropriate temperature control (cooling) is needed since the aluminum may be deformed or melted at a temperature in the range of 200° C. to 700° C. The temperature control by the cooling pipe 125 may be the same as the cooling pipe 116, or other known methods may be applied.

Figure 9:
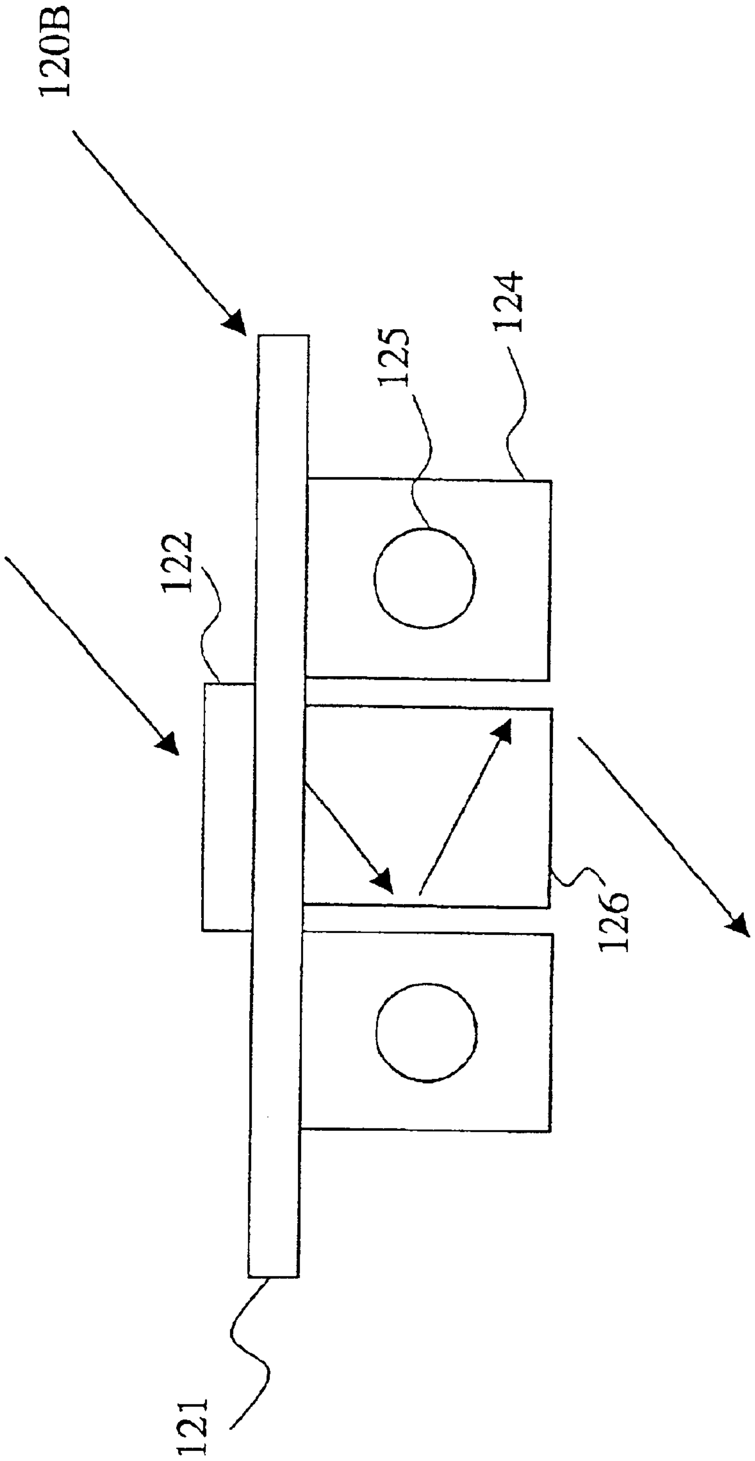
FIG. 9 is an enlarged cross-sectional view of a quartz window, which is another variation of the quartz window shown in FIG. 2.

A description will now be given, with reference to FIG. 9, of a quartz window 120B which is another variation of the quartz window 120 according to the present embodiment. FIG. 9 is an enlarged cross-sectional view of the quartz window 120B. The quartz window 120B has the same structure as the quartz window 120A shown in FIG. 8 except for waveguiding parts 126 having a square cross section being provided under the respective lens assemblies 122. The quartz window 120B can provide an improved irradiation efficiency than the quartz window 120A due to the waveguiding parts 126. Referring to FIG. 8, the radiation light emitted by the lamps 130 indicated by arrows generated energy loss about 10% when the radiation light is reflected by the reinforcing members 124. The rate of energy loss is dependent on the height of the reinforcing members 124 and other parameters. The energy loss can be decreased by forming a metal film having a high reflective index on the surface of the reinforcing members 124 by, for example, gold plating. However, such a metal film is not preferable since it may become a source of pollution with respect to the wafer W. Additionally, there is no material which is applicable to the reinforcing members 124 and has no reflective loss.

In order to reduce such an energy loss, the quartz window 120B is provided with the waveguiding parts 126 which has a square cross section and extending in parallel to the respective lens assemblies 122. The waveguiding parts 126 may be bonded to the quartz plate 121 by welding or may be integrally formed with each other. The waveguiding parts 126 are preferably made of quartz, and have a refractive index of about 1.4. Since the refractive index of vacuum and air is about 1.0, the radiation light is totally reflected within the quartz made waveguiding parts 126 according to the relationship between the refractive indexes of quartz and vacuum or air. Thus, the energy loss of the quartz window 120B is reduced to zero in theory.

Figure 10:
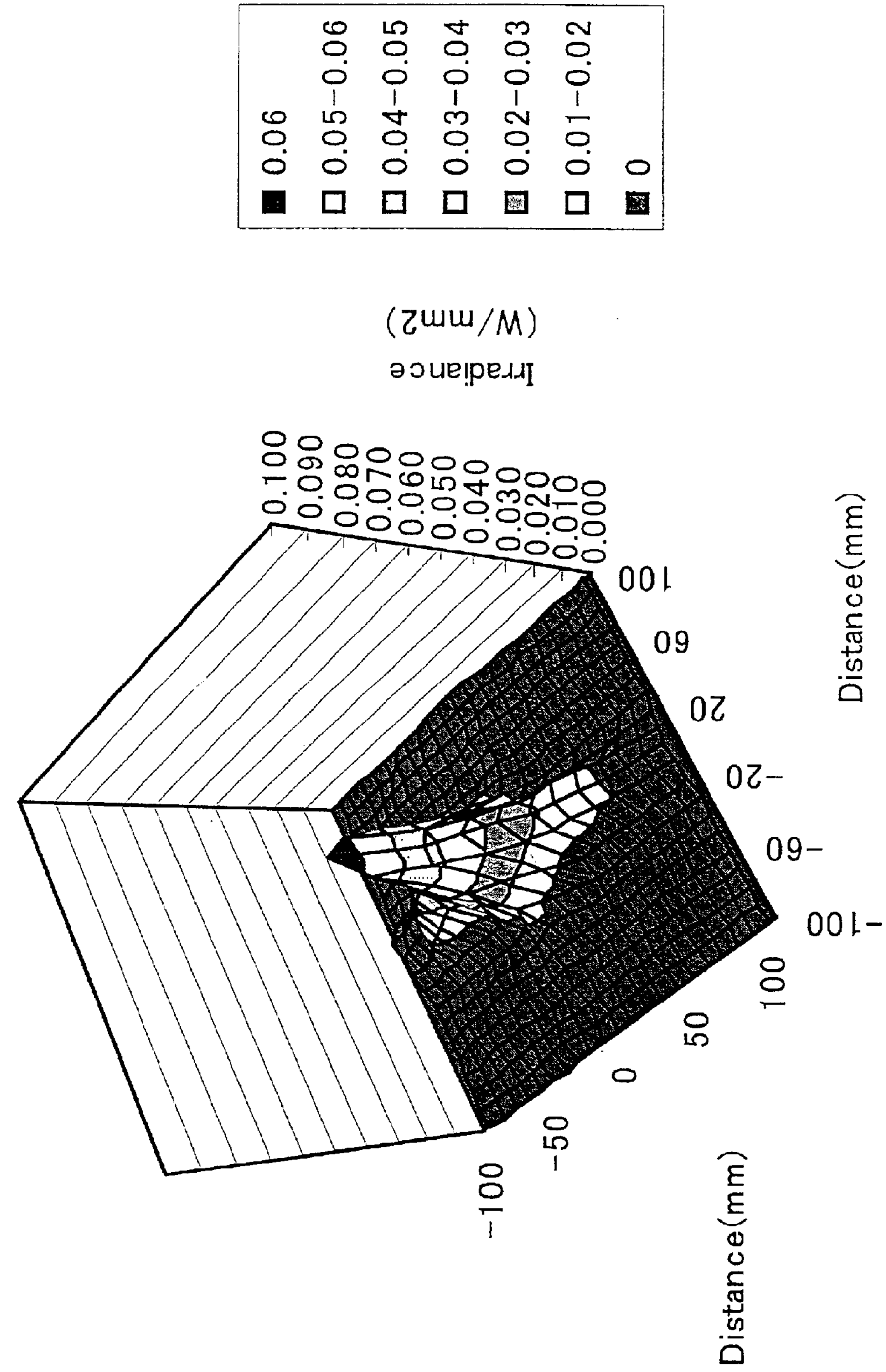
FIG. 10 is a graphic illustration showing a directivity achieved by the quartz window shown in FIG. 9.
Figure 11:
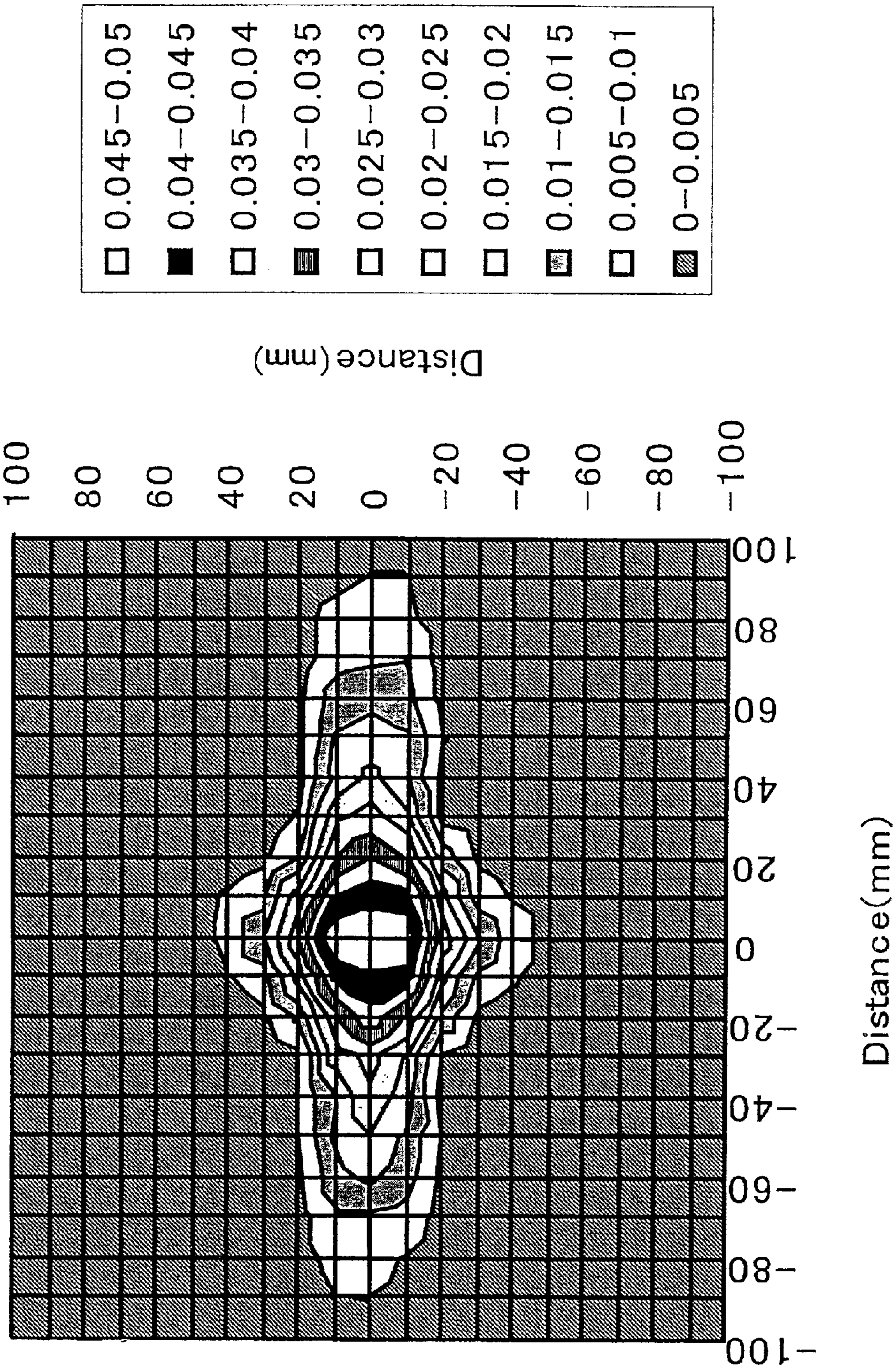
FIG. 11 is a graphic illustration of the directivity shown in FIG. 10 viewed from above.

FIGS. 10 and 11 are graphic illustrations showing the directivity achieved by the quartz window 120B shown in FIG. 9. In FIG. 10, the center of the wafer coincides with the origin (0, 0) of coordinates, and a relationship between distances in the X and Y direction shown in FIG. 3 and irradiance of the radiation light irradiated onto the wafer W is indicated in a three-dimensional manner. FIG. 11 shows the graphic illustration shown in FIG. 10 from above.

The above-mentioned relationship was obtained by using a 750 W-lamp as the lamp 130 having a plated part 149 formed by a gold plate film. A distance between the lower end of the lamp 130 and the upper end of the lens assembly 122 was 2 mm. A distance between the wafer W and the aluminum made reinforcing part 124 was 20 mm. Additionally, in FIG. 20, the thickness of the quartz plate 121 was set to 5 mm, the radius was set to 10 mm, and the width was set to 19 mm. Additionally, the width of each waveguiding part 126 was set to 19 mm, and the height was set to 18 mm. Further, a distance between the adjacent reinforcing members 124 was set to 21 mm.

Figure 13:
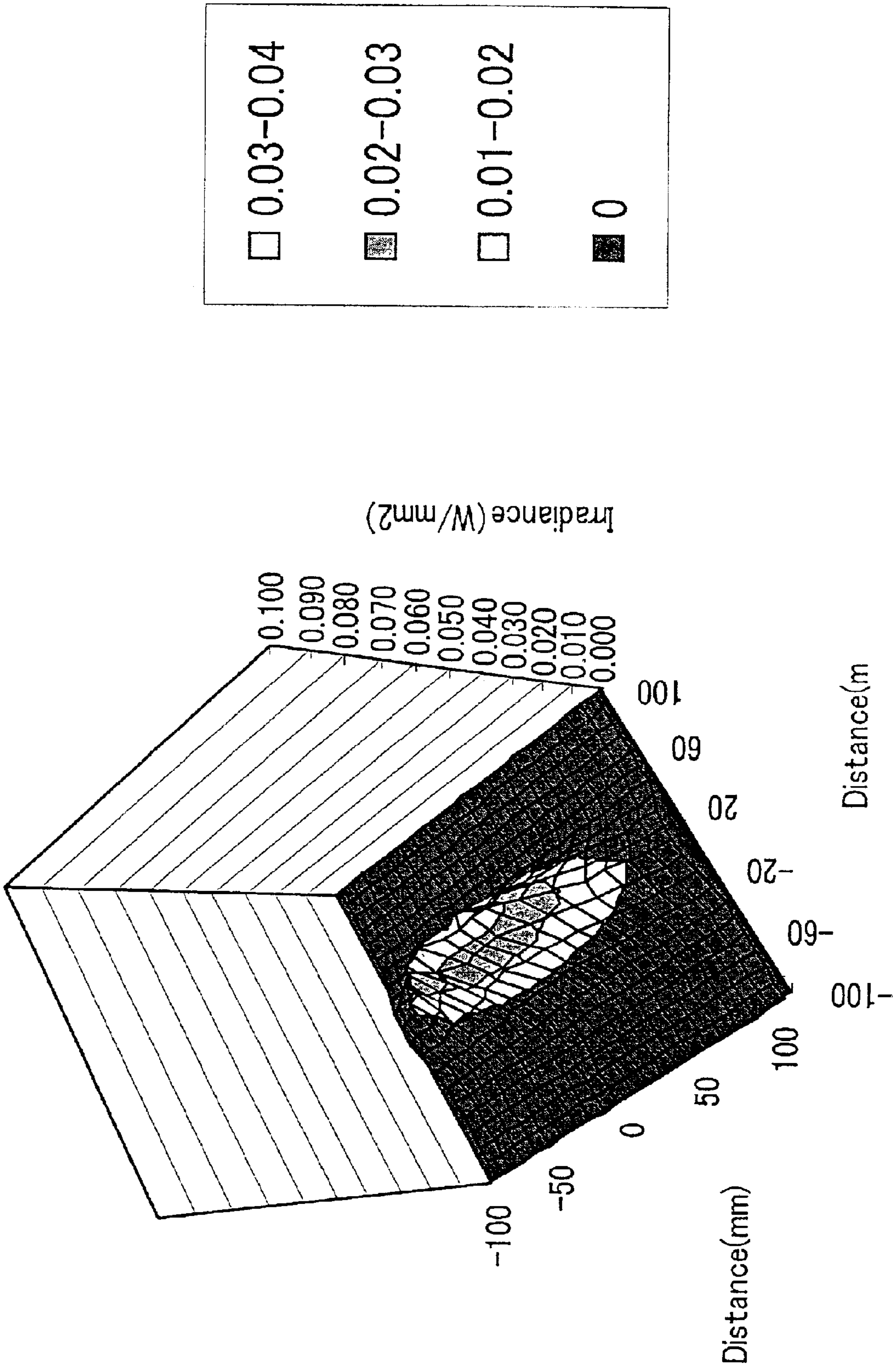
FIG. 13 is a graphic illustration showing a directivity achieved by the quartz window shown in FIG. 12.
Figure 14:
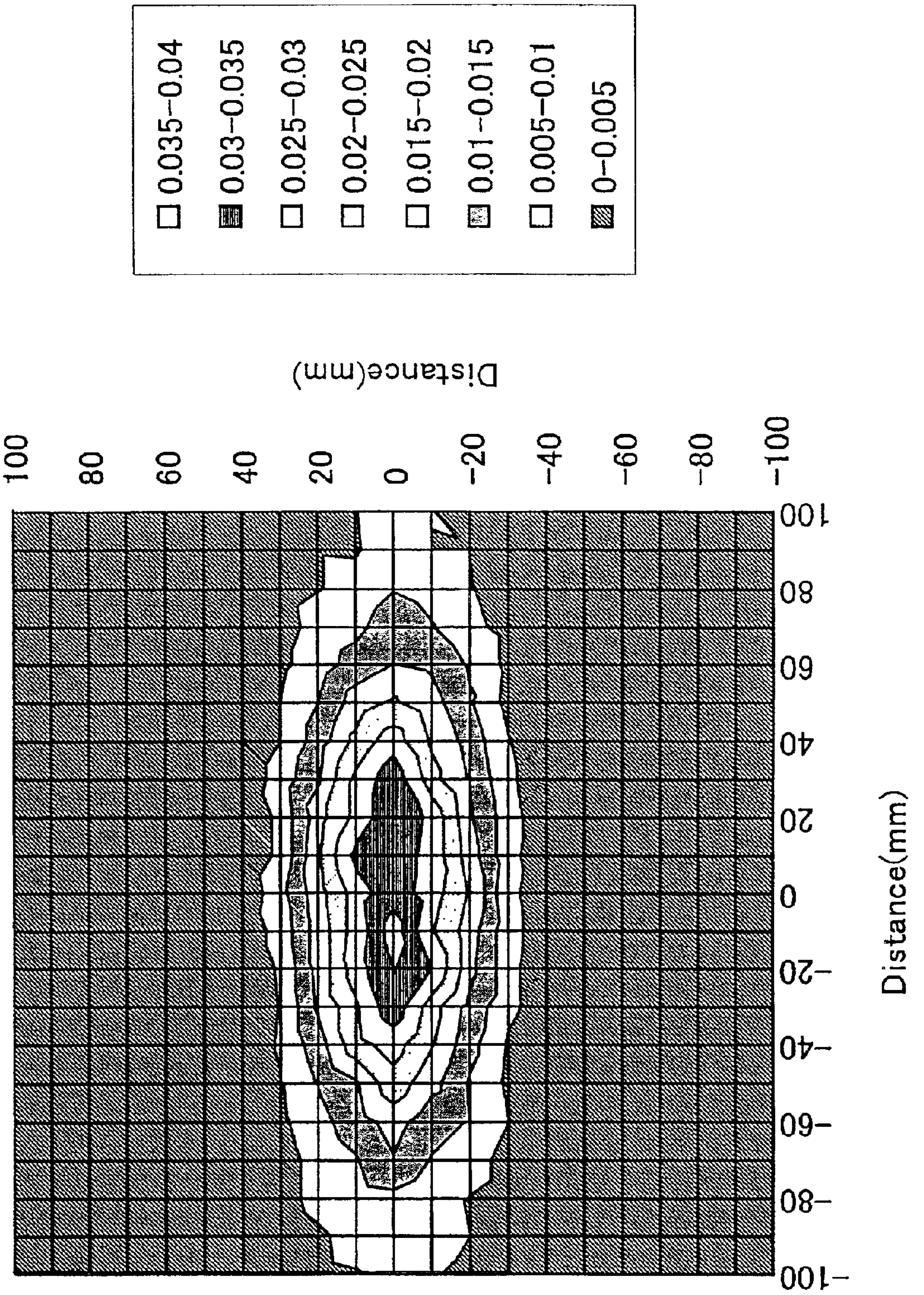
FIG. 14 is a graphic illustration of the directivity shown in FIG. 13 viewed from above.

FIGS. 13 and 14 are graphic illustrations showing the directivity achieved by the quartz window 120C shown in FIG. 12. In FIG. 13, the center of the wafer coincides with the origin (0, 0) of coordinates, and a relationship between distances in the X and Y direction shown in FIG. 3 and irradiance of the radiation light irradiated onto the wafer W is indicated in a three-dimensional manner. FIG. 14 shows the graphic illustration shown in FIG. 13 from above.

The above-mentioned relationship was obtained by using a 750 W-lamp as the lamp 130 having a plated part 149 formed by a gold plate film. A distance between the lower end of the lamp 130 and the upper end of the lens assembly 122 was 2 mm. A distance between the wafer W and the aluminum made reinforcing part 124 was 20 mm. Additionally, in FIG. 23, the thickness of the quartz plate 121 was set to 5 mm. A distance between the adjacent reinforcing members 124 was set to 21 mm.

Figure 21:
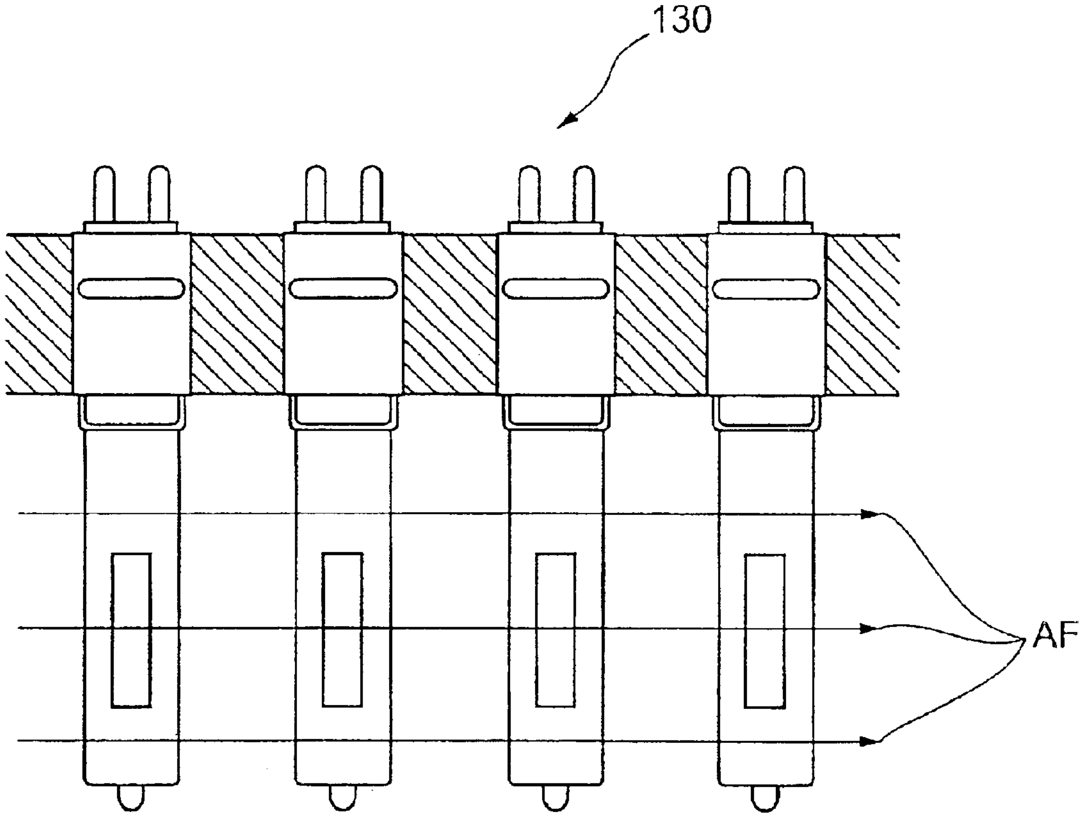
FIG. 21 is a cross-sectional view for explaining a cooling arrangement of the lamps.
Figure 22:
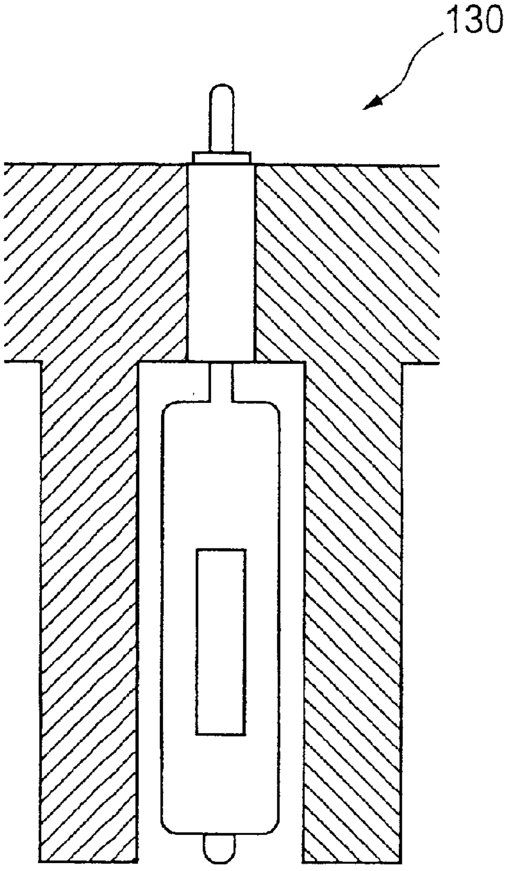
FIG. 22 is a side view of the lamp shown in FIG. 21.

It can be interpreted from FIGS. 21 and 22 that the irradiance is sharply maximized near the center of the wafer W, and the directivity is improved by the quartz window 120B. Additionally, a half spread (may be referred to as "half value width") of the maximum height (a maximum irradiance) forms a generally circular shape and the maximum of the half value width is about 40 mm. The controllability is more improved as the half width becomes closer to a complete circle and the value of the half value width is reduces.

On the other hand, it can be appreciated from FIGS. 13 and 14 that the irradiance is maximum near the center of the wafer W, but the maximum value is not so large. Additionally, the half value width forms a generally oblong shape, and the maximum of the half value with is about 100 mm. The directivity is improved as the maximum value is increased. Additionally, the controllability of the half value width can be improved as it approaches a circle and its value is decreased. Here, the controllability represents easiness of process when it is needed to heat a desired position of the wafer W (that is, irradiate the radiation light) and heat if not applied to a position where it is not desired to heat. Comparing FIGS. 10 and 11 with FIGS. 13 and 14, it can be appreciated that the quartz window 120B is superior to the quartz window 120C in both directivity and controllability.

The above-mentioned quartz windows are not always needed to be used with the lamps 130 which do not need a reflector. In other words, the above-mentioned quartz windows can be applied to a heat treatment apparatus which has a reflector due to their strength and directivity. In such a case, the reinforcing members 124 having a waveform cross section are suitable for a wave-shaped reflector.

Figure 15:
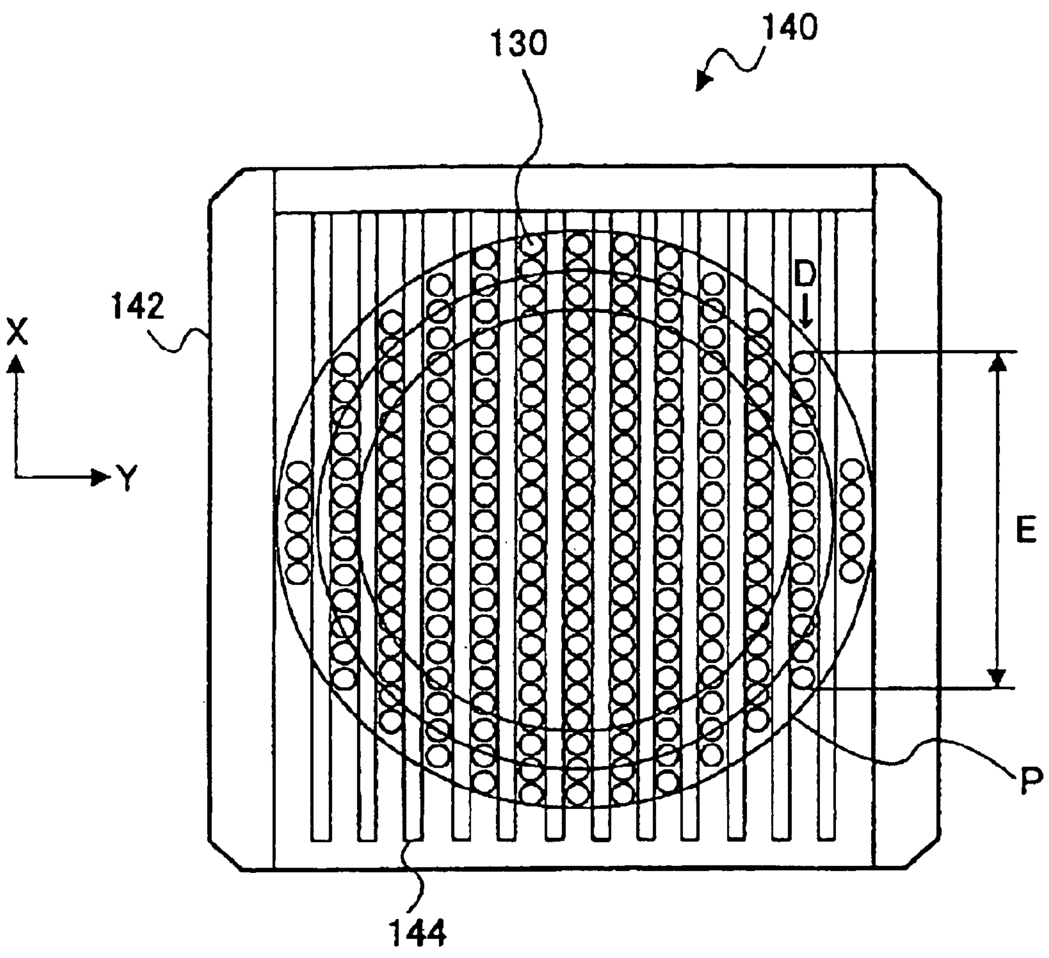
FIG. 15 is a bottom view of a heating unit shown in FIG. 2.
Figure 16:
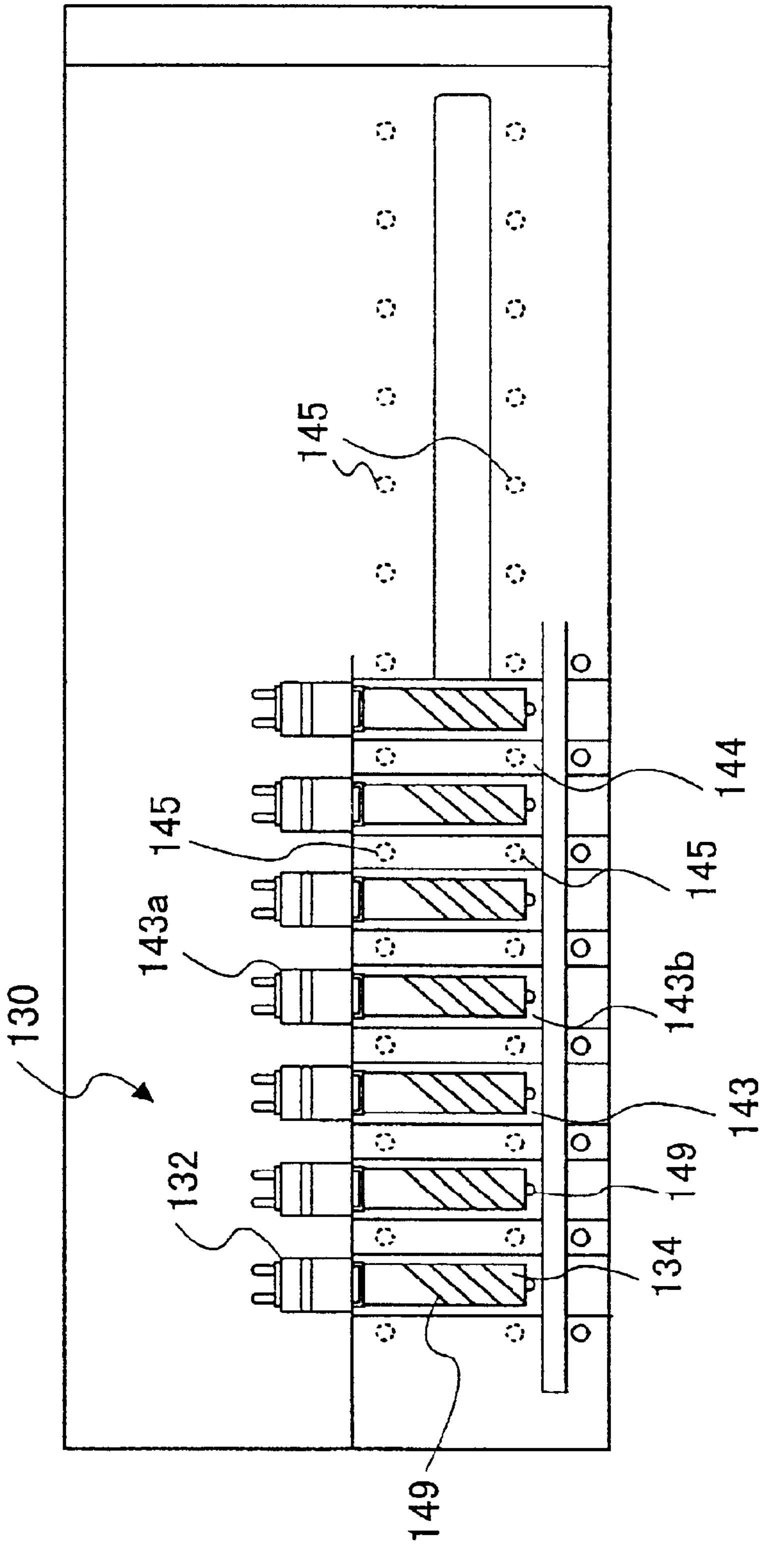
FIG. 16 is a partial cross-sectional view of the heating unit shown in FIG. 2.
Figure 17:
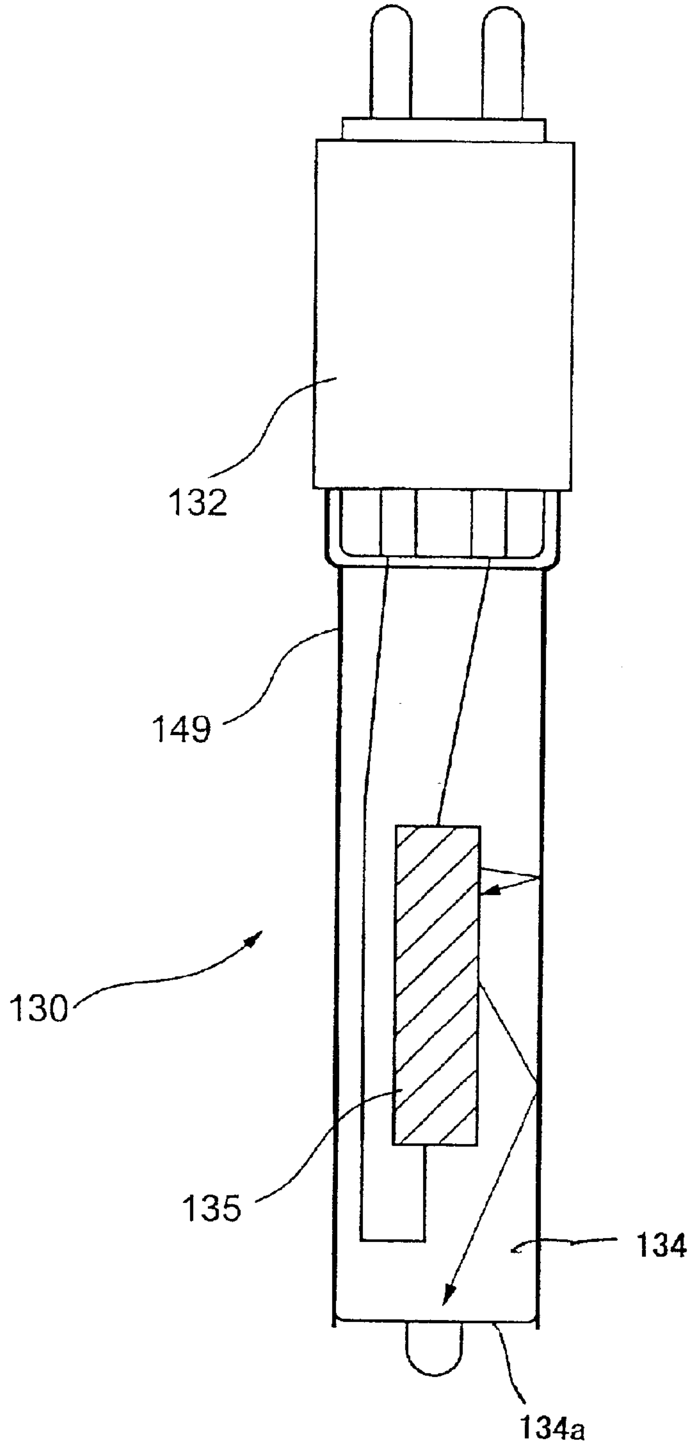
FIG. 17 is a front view of a lamp shown in FIG. 16.
Figure 18:
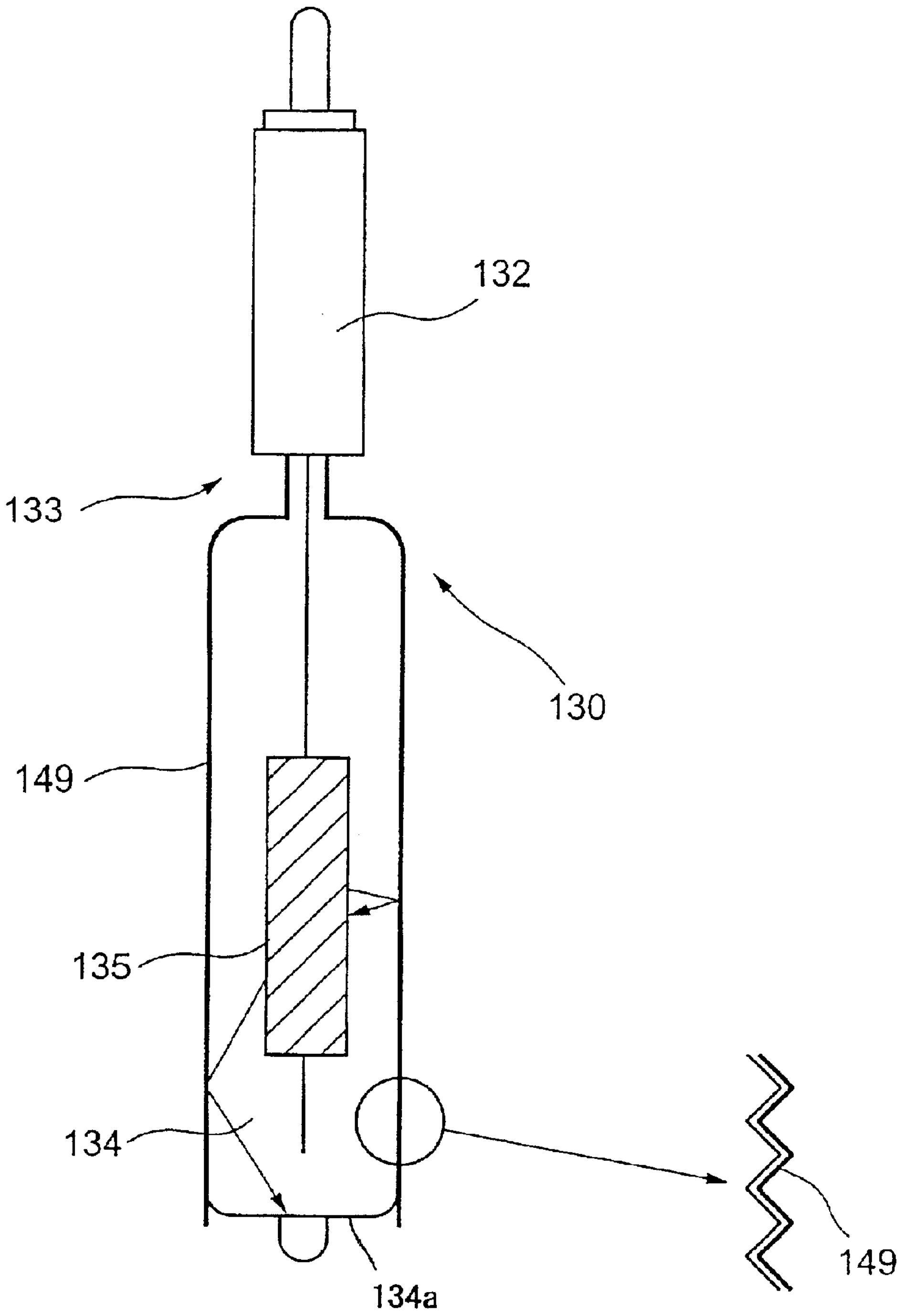
FIG. 18 is a side view of the lamp shown in FIG. 16.

A description will now be given, with reference to FIGS. 15 through 18, of the heating unit 140 according to the present embodiment. FIG. 15 is a bottom view of the heating unit 140. FIG. 16 is a partial cross-sectional view of the heating unit 140. FIG. 17 is a front view of the lamp 130 shown in FIG. 16. FIG. 18 is a side view of the lamp 130 shown in FIG. 16. As shown in FIG. 15, the arrangement of the lamps 130 correspond to the arrangement of the lens elements 123 shown in FIG. 3. The heating unit 140 comprises the lamps 130 and a lamp support part 142.

Although each lamp 130 in the present embodiment is a single end type as shown in FIG. 16, the lamp 130 can be a double end type as explained later, or other heat sources such as an electric wire heater may be used. The single end type refers to a kind of lamp having a single electrode part 132 as shown in FIG. 16. The double end type refers to a kind of lamp having two ends like a fluorescent lamp. The lamps 130 serve as a heat source to heat the wafer W. In the present embodiment, the lamps 130 are not limited to but halogen lamps. The output of the lamps 130 is determined by a lamp driver 310. That is, the lamp driver is controlled by the control part 300 so as to supply a power to the lamps 130.

As shown in FIG. 17, each lamp 130 comprises the single electrode part 132 and a light-emitting part 134. The light-emitting part 134 is made of glass which transmits a light generated by a filament 135 sealed in the light-emitting part 134. The light-emitting part 134 extends from the electrode part 132. A plated part 149, which is a high-reflectance film, is formed around the light-emitting part 134. As indicated by dashed lines in FIG. 15, the plurality of lamps 130 are arranged along a plurality of lines in response to the lens elements 123 of the lens assemblies 122 so as to evenly heat the wafer W having a circular shape. Additionally, as mentioned above, since the reflector is not present between adjacent lamps 130 in the direction X as shown in FIG. 15, a distance between the adjacent lamps 130 in the direction X can be maintained as small as 3 mm, which contributes to an increase in the density of lamps and an increase in a power density. Additionally, as mentioned later, such a rectilinear arrangement of the lamps 130 contributes to the suitable heat exhaust (for example, 4 $m^3$/min).

As shown in FIG. 18, a neck part 133 is formed as a part of the light-emitting part 134 under the electrode part 132, and the plated part 149 is also formed around the neck part 133. Referring to FIG. 2, a power supplied to the electrode part 132 is determined by the lamp driver 310, and the lamp driver 310 is controlled by the control part 300. Referring to FIG. 17, in the present embodiment, the height of the electrode part 132 is about 25 mm; the height of the light-emitting part 134 is about 65 mm, the thickness is about 1 mm; and the length of the filament 135 is about 25 mm. Additionally, referring to FIG. 18, in the present embodiment, the width of the electrode part 132 is about 5 mm and the width of the light-emitting part 134 (not the neck part 133) is about 15 mm. Nitrogen or argon gas and halogen gas are charged in the light-emitting part 134. The filament 135 is made of tungsten. A distance between a lower part of the filament 135 and a bottom surface 134*a* of the light-emitting part 134 is set within a predetermined range, thereby maintaining the directivity and the service life of the lamps. If the distance is too small, the directivity of the lamps 130 is deteriorated, and if the distance is too large, the halogen cycle is in sufficient which results in reducing the service life of the lamps.

Referring to FIGS. 15 and 16, the lamp support part 142 has a generally rectangular parallelepiped shape. The lamp support part 142 has a plurality of separation walls 144 and a plurality of cylindrical grooves which accommodate the lamps 130. Each of the cylindrical grooves comprises a part 143*a* which accommodates the electrode part 132 of the lamp 130 and a part 143*b* which accommodates the light-emitting part 134 of the lamp 130. The electrode part 132 of each lamp 130 is connected to the lamp driver 130 shown in FIG. 2. The part 143*a* serves as a sealing part. The diameter of the part 143*b* is larger than the diameter of the light-emitting part 134.

Each separation wall 144 has a width of about 12 mm, and is located above the passage 128 shown in FIG. 3 and the reinforcing member 124 shown in FIG. 8 and between the adjacent grooves 143 arranged in the direction X shown in FIG. 15. A pair of cooling pipes 145 arranged in parallel to the passage 128 (in the direction X shown in FIG. 15) are put in contact with the separation walls 144. About 0.3 to 0.8 $m^3$ of air can flow through the groove 143 excluding the light emitting part 134 so as to cool the surface of the light-emitting part 134. Thus, the lamps 130 of the present embodiment can be cooled by the air cooing arrangement and the cooling pipes 145.

The lamps can be cooled by the air cooling arrangement alone by removing the separation walls and the cooling pipes 145. As mentioned later, the plated part 149 is formed by gold plating, the temperature of the plated part 149 is maintained below 500° C. so as to prevent a temperature destruction such as exfoliation of gold plate. The temperature control by the cooling pipe 145 can be the same as the cooling pipes 116, and other known methods may be applied. Even when the plated part 149 has a heat resistance exceeding 500° C., the temperature of the lamps 130 is preferably controlled to be below 900° C. by the cooling pipes 145 or other cooling arrangements since transmittance is deteriorated (a phenomenon in which the light-emitting part 134 becomes white) if the temperature of the lamps 130 exceeds 900° C.

In the present embodiment, the separation walls 144 and the cooling pipes 145 are arranged along the direction X in FIG. 15, and a two-dimensional arrangement in the X and Y directions is not used as in a conventional reflector. Accordingly, the structure of the lamp support part 142 according to the present embodiment contributes to an increase in the lamp density and the power density of the lamps 130. For example, when the lamps are arranged with a conventional reflector (for example, a diameter of 50 mm), the lamp density is 0.04 unit/$cm^2$. On the other hand, the lamp density achieved by the present embodiment is 0.16 unit/$cm^2$. In a case in which the lamps 130 and the lamp support part 142 are cooled by air cooling alone instead of providing the separation walls 144 and the cooling pipes 145, the lamp density is increased to about 0.40 unit/$cm^2$ at maximum. Generally, the power density required for an RTP is determined by a lamp power per one lamp and a lamp density. The lamp density can be decreased as the lamp power is increased. The arrangement of the lamps in the present embodiment can be applied to RTP which requires a further rapid temperature rising in the feature.

Figure 20:
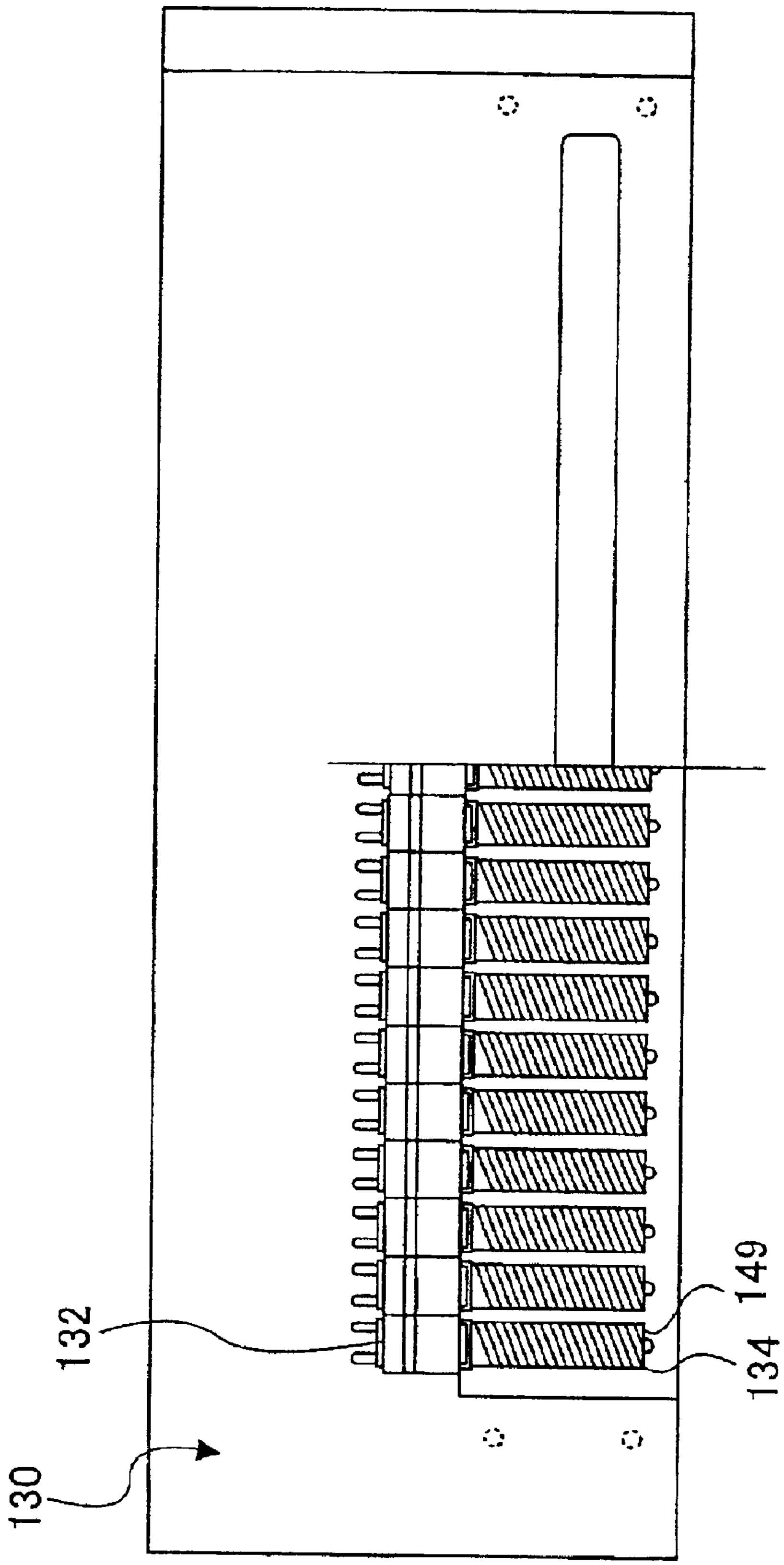
FIG. 20 is a partially cross-sectional view of the heating unit shown in FIG. 19.

A description will now be given, with reference to FIGS. 19 and 20, of a heating unit 140A which is a variation of the heating unit shown in FIG. 15. The heating unit 140A improves the lamp density by removing the separation walls 144 and the cooling pipes 145 from the heating unit 140A. Since the cooing pipes 145 are not provided in to the lamp support part 142, the lamps 130 are sorely cooled by air cooling. The lamp density of the heating unit 140A is twice that of the heating unit 140. Since the reflector which conventionally requires the plated part 149 is removed, such a high-density lamp mount can be achieved.

Figure 23:
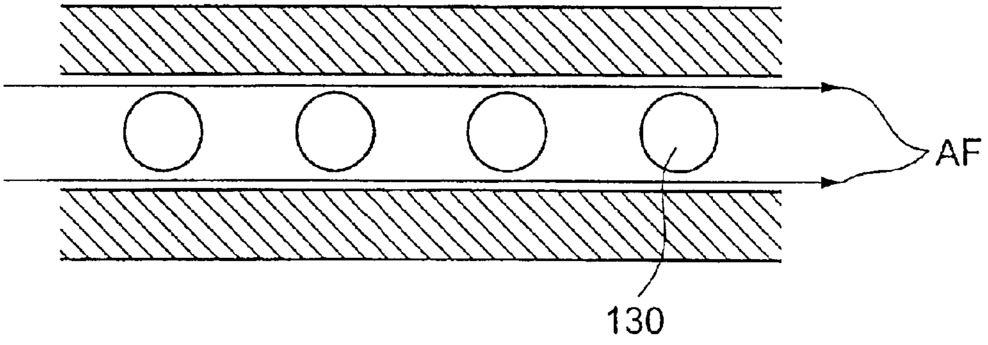
FIG. 23 is a plan view of the lamp shown in FIG. 21.

A description will now be given, with reference to FIGS. 21 to 23, of the cooling arrangement of the lamps 130. FIG. 21 is a cross-sectional view for explaining the cooling arrangement of the lamps 130 arranged in the direction X in FIG. 15. FIG. 22 is a side view of the lamp 130 shown in FIG. 20. FIG. 23 is a plan view of the lamp 130 shown in FIG. 21. As shown in the figures, the plurality of lamps 130 arranged in the same row are subjected to heat exhaust (air cooling) by a blower. The exhaust efficiency by the blower is as good as 4 $m^3$/min with respect to that achieved by a rectilinear arrangement of the lamps. In a case such heat exhaust is performed, heated are can be exhausted out of the heat treatment apparatus 100, or alternatively circulated. If the heated air is circulation, a radiator is provided so as to cool the heated air. In such a case, a load to an exhaust system is small due to the good exhaust efficiency being achieved.

Figure 26:
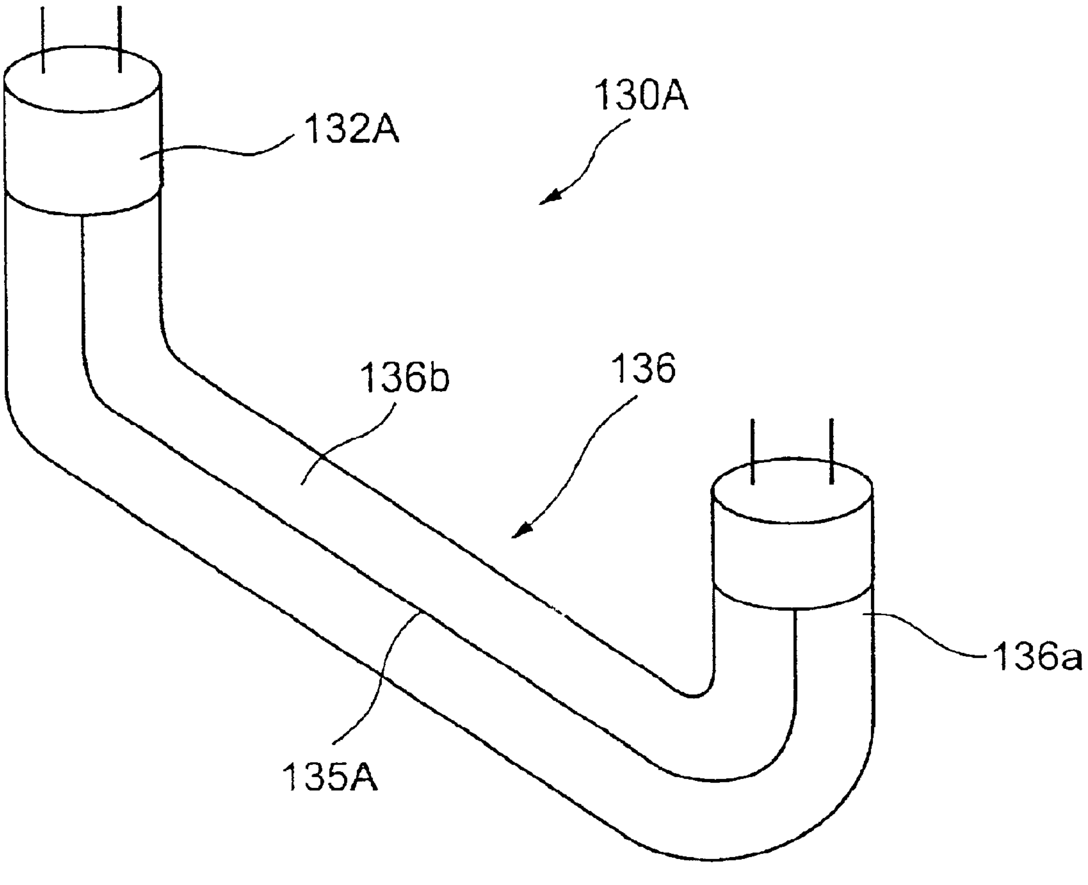
FIG. 26 is a perspective view of a double end type lamp from which a plated part is removed.

The plated part 149 has a function to reflect the heat radiation light of the lamps 130 at a high reflectance within the light-emitting part 134. By providing the light-emitting part 134 having a high reflectance, the directivity of the light-emitting part 134 (radiation light emitted by the filament 135) to the wafer W is improved. As a result, the plated part 149 excludes the reflector (reflective plate), which is conventionally provided outside the light-emitting part. Since the reflector is not used, the plurality of lamps 130 can be mounted at a high density. For example, the lamps 130 can be arranged at an interval of 3 mm in the direction X as shown in FIG. 26, and can be mounted at a lamp density of 0.16 unit/$cm^2$ which is four times the lamp density (0.04 unit/$cm^2$) of the arrangement having a reflector inclined by 45 degrees. Accordingly, the power density can be increased and, therefore, the heat treatment apparatus 100 according to the present embodiment is suitable for RTP.

The plated part 149 is formed by various plating methods or other methods on the light emitting-part 134 including the neck part 133 except for the bottom surface 134*a* of the light-emitting part 134. Accordingly, the directivity of the lamps 130 can be improved by the light directly irradiated on the wafer W and the light reflected by the plated part 149.

The plated part 149 if formed of a metal film such as a gold film or silver film which reflects a radiation light at a high reflectance. The plated part 149 may be formed by electroplating such as hard gold plating or pure gold plating. The thickness of the plated part 149 can be about 10 $\mu$m so as to sufficiently prevent light leakage from the light-emitting part 134. It should be noted that the plated part 149 is provided for improving the directivity, and there is no specific range of high-reflectivity of the plated part 149.

Figure 24:
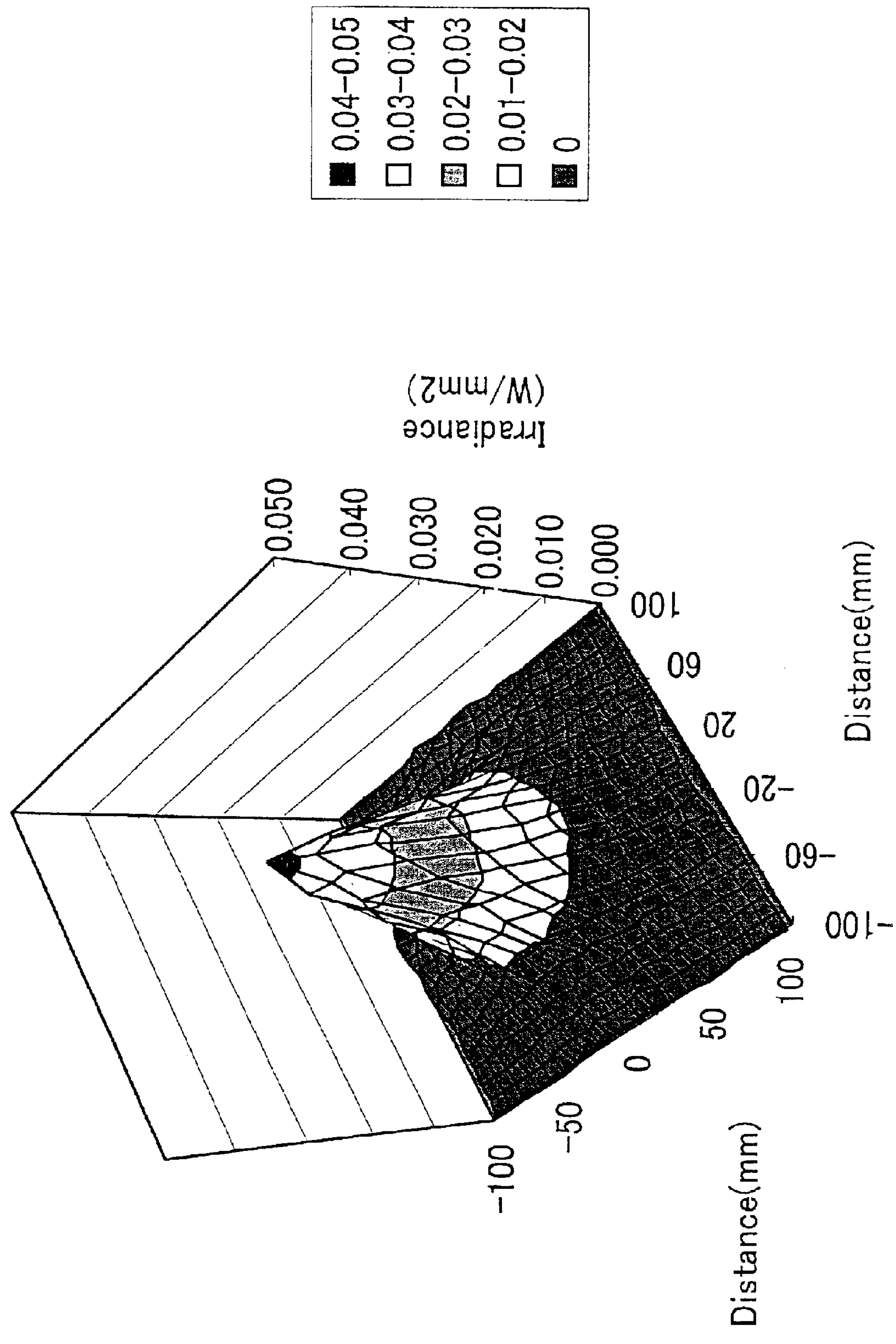
FIG. 24 is a graphic illustration showing the directivity achieved by a lamp having a plated part formed of a gold plate film.
Figure 25:
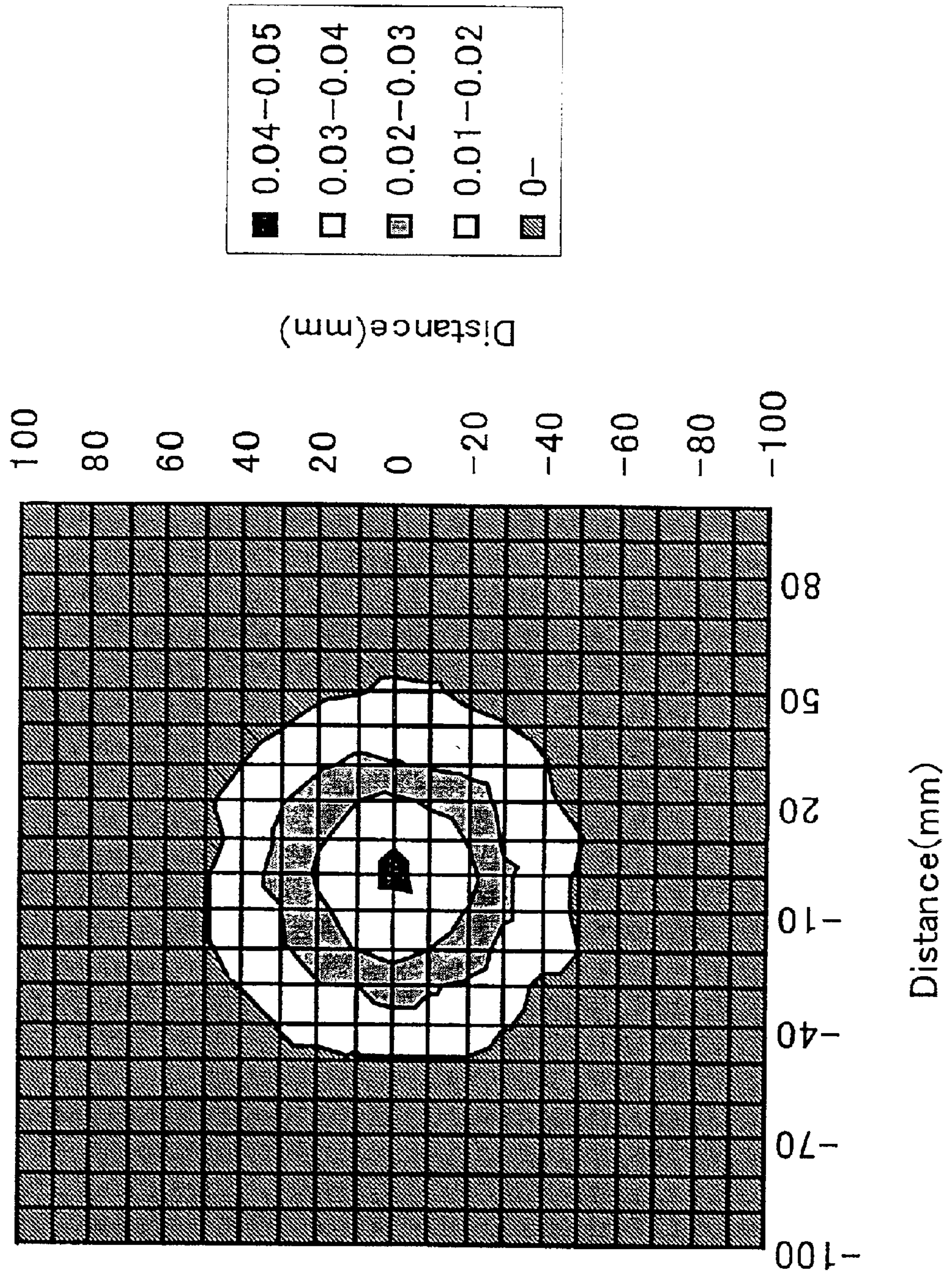
FIG. 25 is a graphic illustration of the directivity shown in FIG. 24 viewed from above.

FIGS. 24 and 25 are graphic illustrations showing the directivity achieved by the lamp 130 having the plated part 149 formed of a gold plate film. In FIG. 24, the center of the wafer W coincides with the origin (0, 0) of coordinates, and a relationship between distances in the X and Y direction shown in FIG. 15 and irradiance of the radiation light irradiated onto the wafer W is indicated in a three-dimensional manner. FIG. 25 shows a graphic illustration of the directivity shown in FIG. 24 viewed from above.

The above-mentioned relationship was obtained by using a 750 W-lamp having the plated part 149 formed of a gold plate film as the lamp 130. The process chamber 110 was maintained at a normal pressure. A distance between the lower end of the lamp 130 and the upper end of a circular quartz window, which is consisted of the quartz plate 121 alone, was 2 mm. A distance between the wafer W and the lower end of the quartz window was 20 mm.

Figure 43:
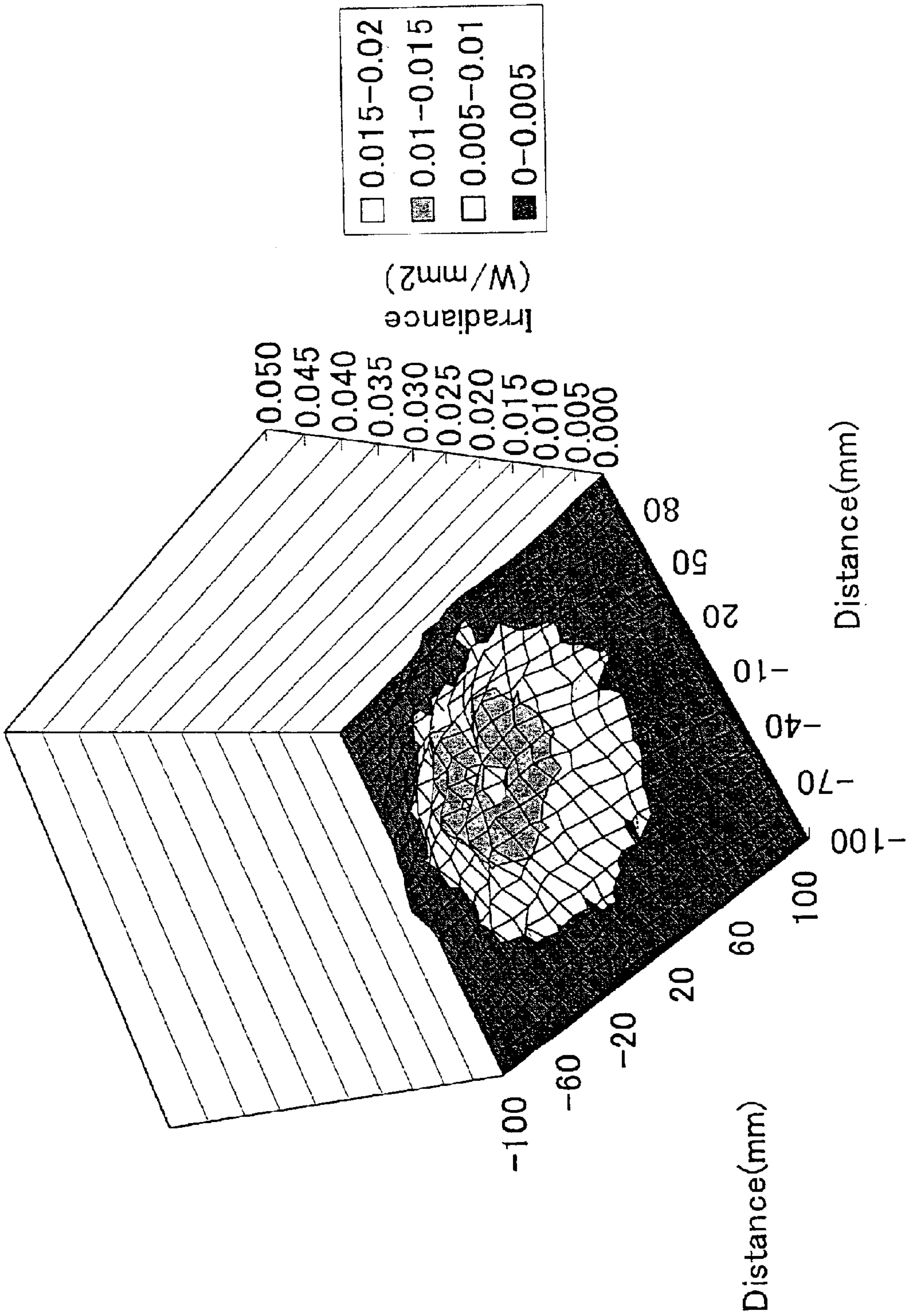
FIG. 43 is an graphic illustration showing the directivity achieved by a conventional single end lamps which does not have a gold plate film.
Figure 44:
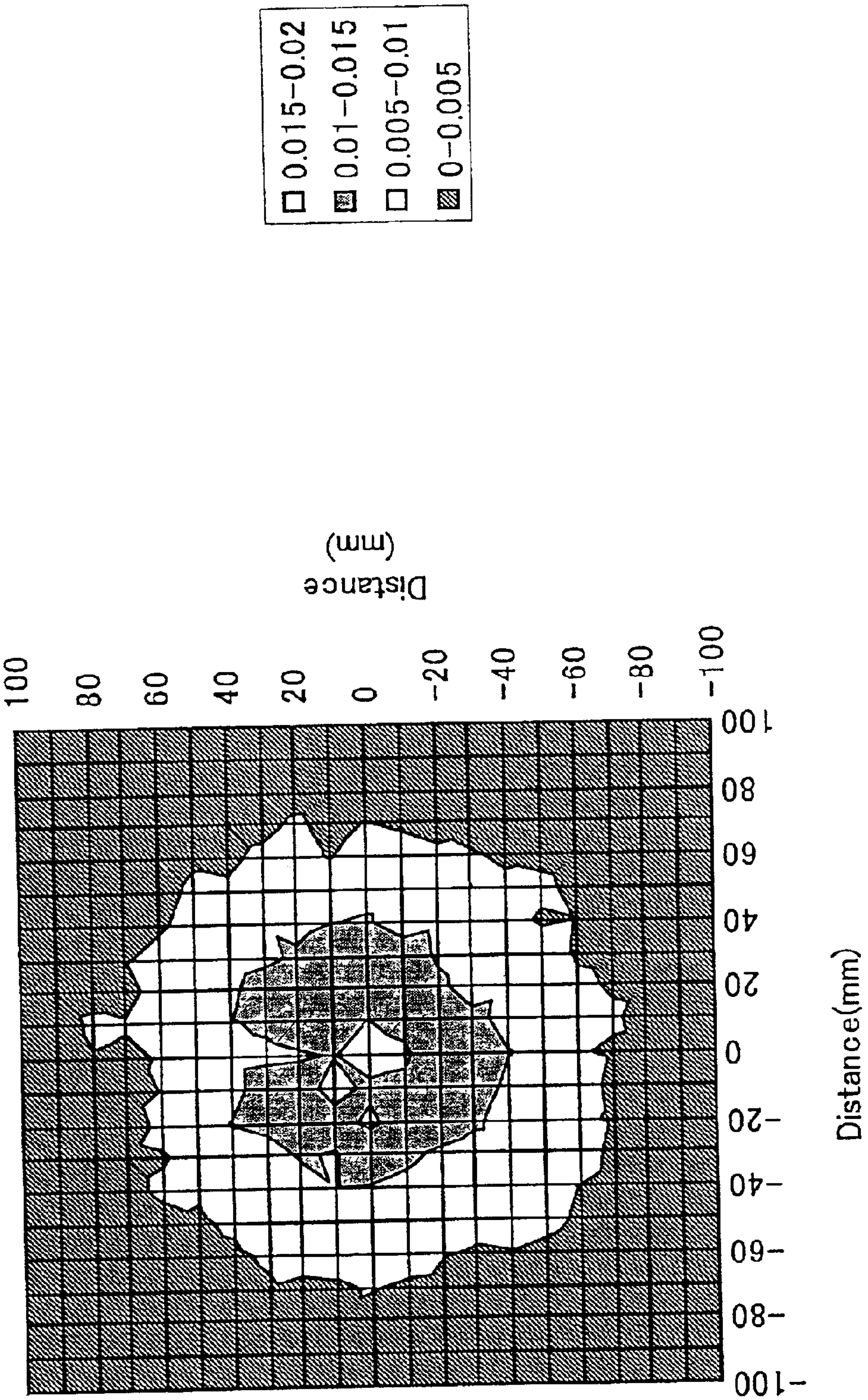
FIG. 44 is a graphic illustration of the directivity shown in FIG. 43 viewed from above.

FIGS. 43 and 44 are graphic illustrations showing the directivity achieved by a conventional single end lamp which does not have a gold plate film. In FIG. 43, the center of the wafer coincides with the origin (0, 0) of coordinates, and a relationship between distances in the X and Y direction shown in FIG. 15 and irradiance of the radiation light irradiated onto the wafer W is indicated in a three-dimensional manner. FIG. 44 shows a graphic illustration of the directivity shown in FIG. 43 viewed from above.

The above-mentioned relationship was obtained by using a 750 W-lamp which does not have the plated part 149 formed of a gold plate film as the lamp 130. The process chamber 110 was maintained at a normal pressure. A distance between the lower end the lamp 130 and the upper end of a circular quartz window, which is consisted of the quartz plate 121 alone, was 2 mm. A distance between the wafer W and the lower end of the quartz window was 20 mm.

It can be interpreted from FIGS. 24 and 25 that the irradiance is sharply maximized near the center of the wafer W, and the directivity is improved by the plated part 149. Additionally, a half spread is about 40 mm. On the other hand, it can be appreciated from FIGS. 43 and 44 that the irradiance is maximum near the center of the wafer W, but the maximum value is not so large. Additionally, the half value width forms a generally oblong shape, and the maximum of the half value with is about 80 mm. Comparing FIGS. 24 and 25 with FIGS. 43 and 44, it can be appreciated that the lamp 130 having the plated part 149 is superior to the conventional lamp having no plated part in both directivity and controllability.

The light-emitting part 134 preferably has unevenness in a portion covered by the plated part 149 as indicated by a circled portion shown in FIG. 18. According to the unevenness, the light reflected by the plated part 149 can be directed to the wafer W without repeating reflection within the cylindrical side surface of the light-emitting part 134. The unevenness can be formed by surface treatment such as sand-blasting or corrosion by a chemical solution.

Figure 27:
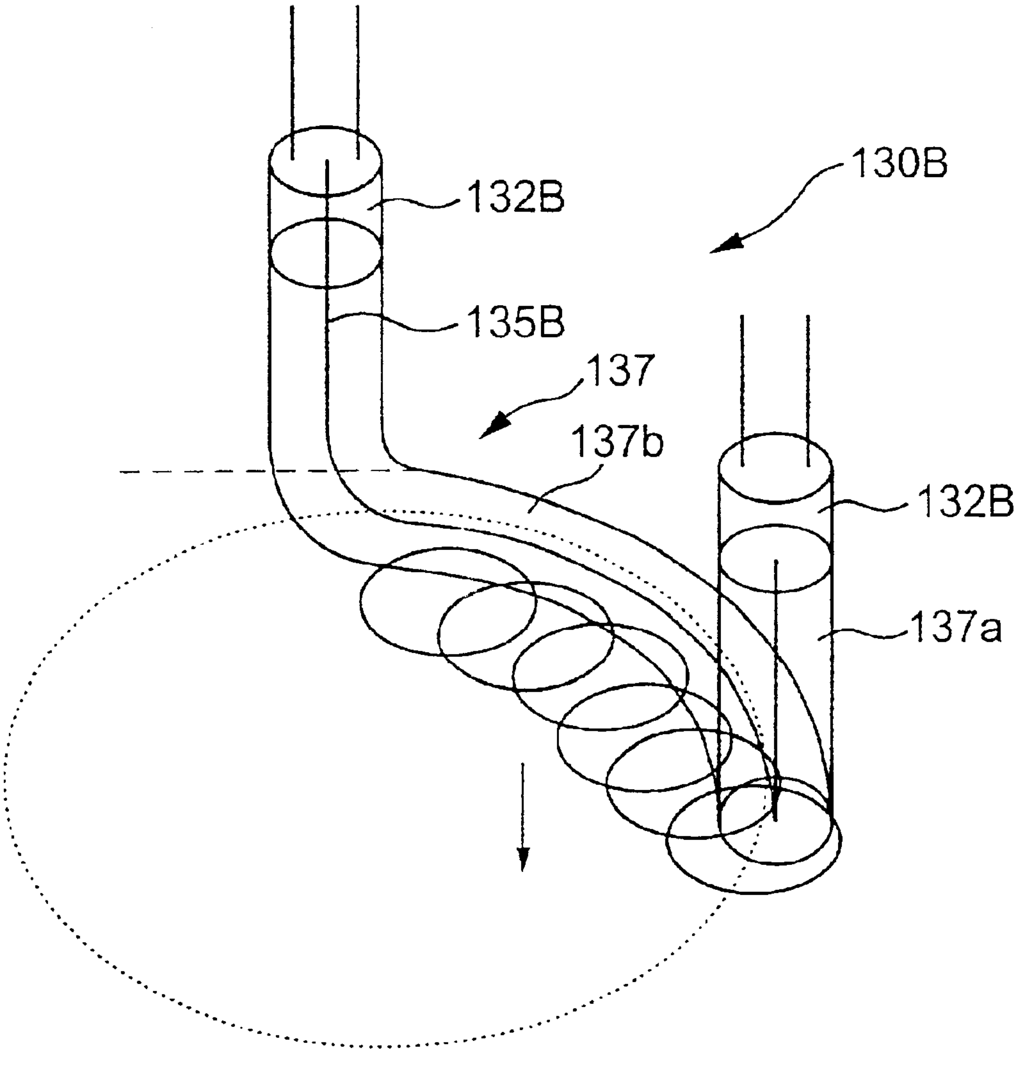
FIG. 27 is a perspective view of another double end type lamp from which a plated part is removed.
Figure 28:
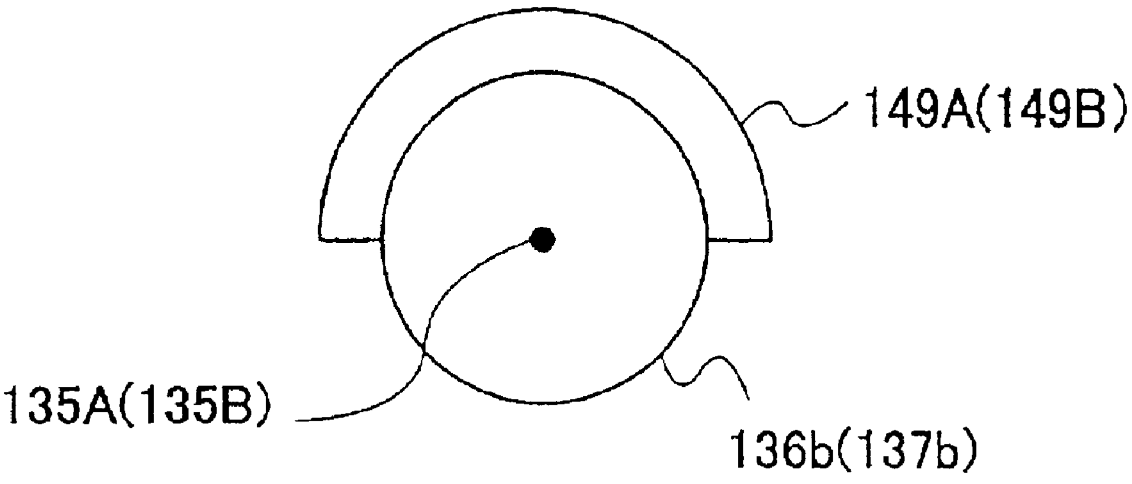
FIG. 28 is a cross-sectional view for explaining the plated parts applied to the lamps shown in FIGS. 26 and 27.
Figure 29:
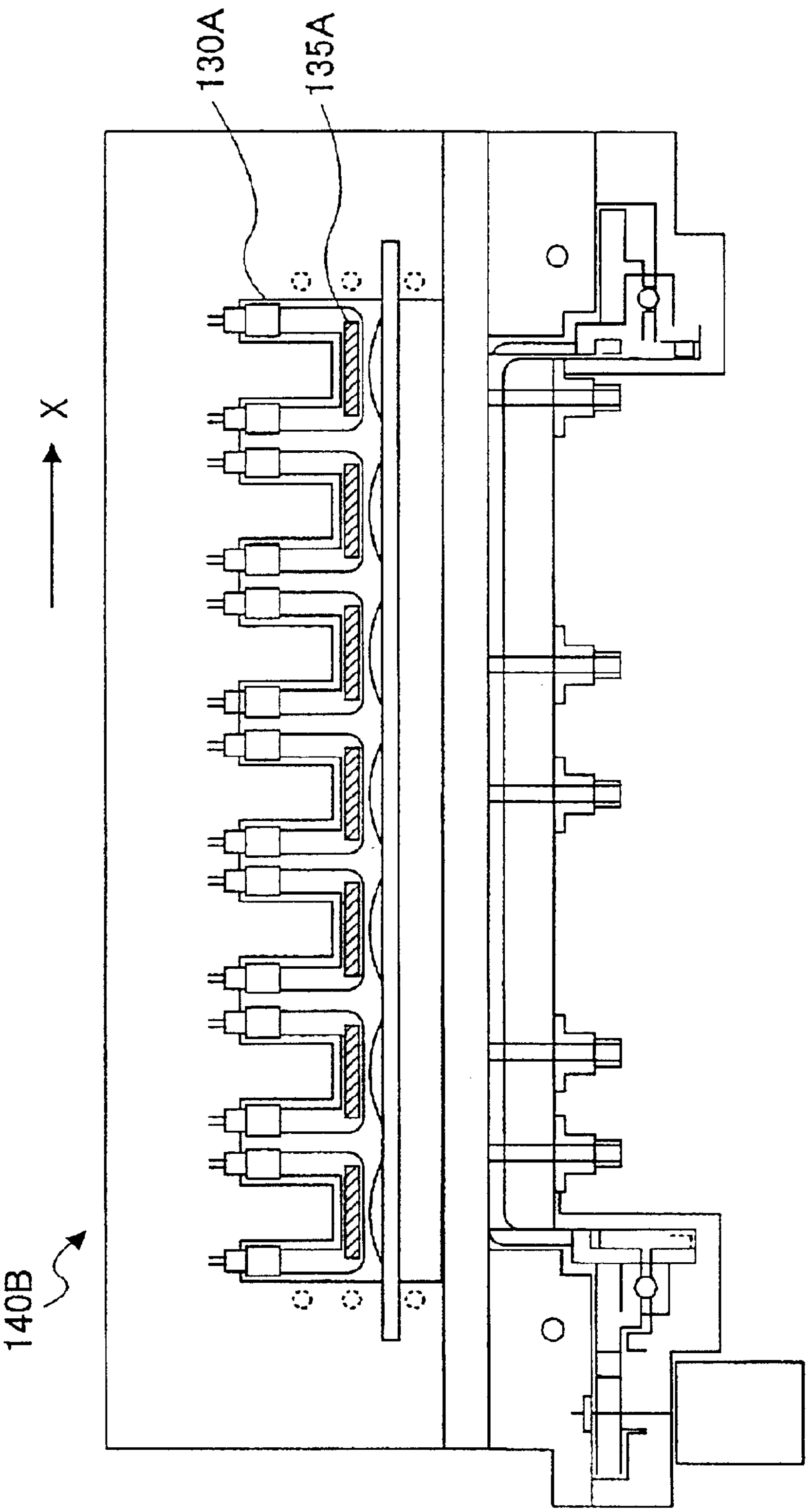
FIG. 29 is a cross-sectional view of a heating unit having the lamps taken along the direction X in FIG. 26.
Figure 30:
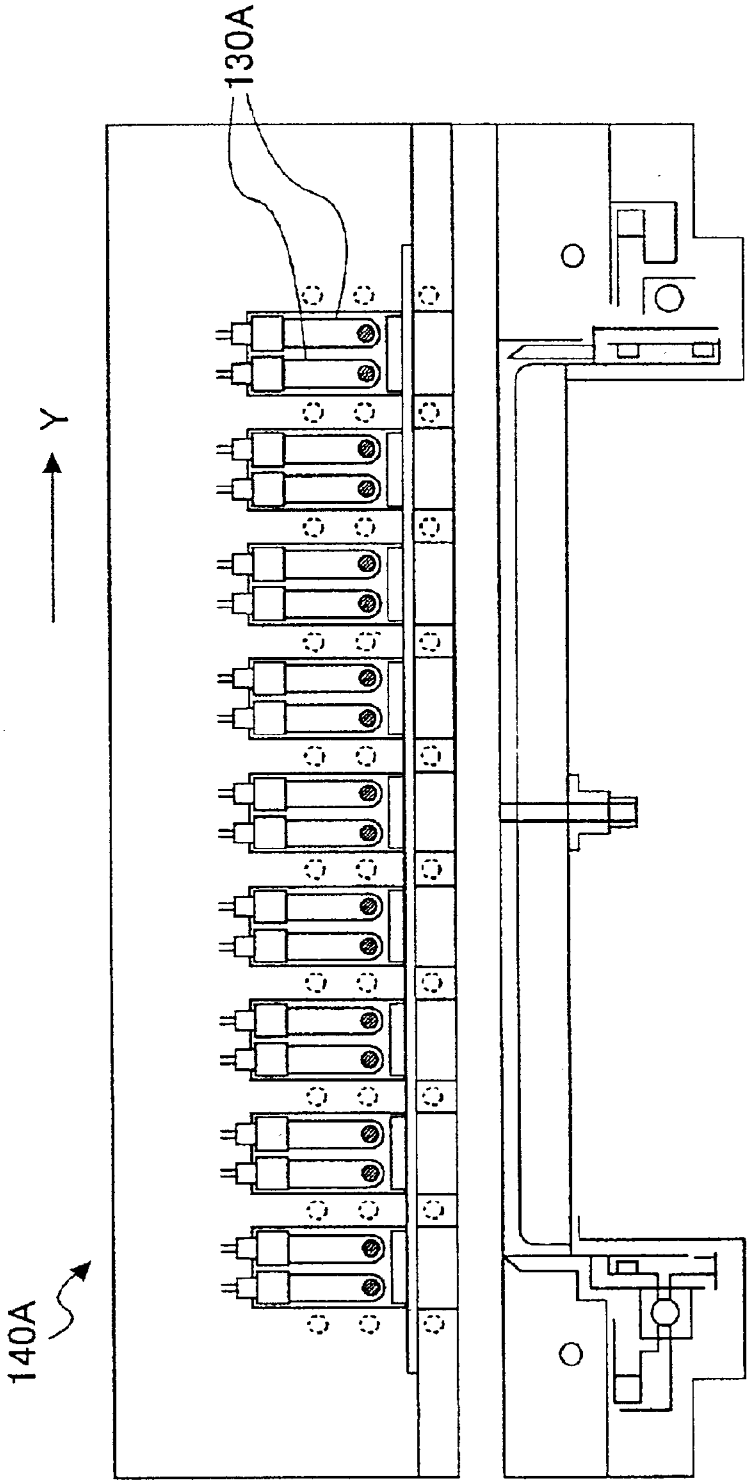
FIG. 30 is a cross-sectional view of the heating unit shown in FIG. 29 taken along the direction Y in FIG. 26.

As mentioned above, the lamp 130 can be of a double end type. A description will now be given, with reference to FIGS. 26 through 30, of a case in which the lamps 130 are replaced by the double end type lamps. FIG. 26 is a perspective view of a double end type lamp 130A from which a plated part 149A is removed. FIG. 27 is a perspective view of another double end type lamps from which a plated part 149B is removed. FIG. 28 is a cross-sectional view for explaining the plated parts 149A and 149B applied to the lamps 130A and 130B, respectively. FIG. 29 is a cross-sectional view of a heating unit 140B having the lamps 130A taken along the direction X in FIG. 15. FIG. 30 is a cross-sectional view of the heating unit 140B shown in FIG. 40 taken along the direction Y in FIG. 15.

FIG. 26 shows one of the double end lamps 130A having a rectilinear shape and arranged in the direction in FIG. 15. FIG. 27 shows one of the arc-like double end lamps 130B which are concentrically arranged as indicated by dashed circles in FIG. 2. It should be noted that the lamp support part must be changed so as to receive the lamps 130A or 130B when the lamps 130 are replaced by the lamps 130A or 130B. For example, the lamp support part 142 may be changed so as to have a plurality of vertical through holes, which accommodate electrode parts 132A and 132B and vertical parts 136*a* and 137*a*, and a plurality of rectilinear or concentric horizontal grooves, which accommodate horizontal parts 136*b* or 137*b*. Referring to FIGS. 29 and 30, each lens arranged directly under the respective one of the lamps 130A has a length corresponding to the light-emitting part 136 shown in FIG. 29 and a width which covers a pair of lamps 130A shown in FIG. 30.

As shown in FIG. 26, each lamp 130A comprises two electrode parts 132A and the light-emitting part 136. The light-emitting part 136 includes a filament 135A which connects the two electrode parts 132A. Similarly, as shown in FIG. 15, the lamp 130B includes two electrode parts 132B and the light-emitting part 137. The light-emitting part 137 includes a filament 135B which connects the two electrode parts 132B. A power supplied to the electrode parts 132A and 132B is determined by the lamp driver 310 shown in FIG. 2. The lamp driver 310 is controlled by the control part 300.

As shown in FIG. 26, the light-emitting part 136 includes the vertical parts 136*a* and the rectilinear horizontal part 136*b* which is bent by 90 degrees with respect to the vertical parts 136*a*. Additionally, as shown in FIG. 27, the light-emitting part 136 includes the vertical parts 137*a* and the arc-like horizontal part 137*b* which is bent by 90 degrees with respect to the vertical parts 137*a*. It should be noted that the double end lamp applicable to the present invention is not limited to the lamps 130A and 130B, and lamps including vertical and horizontal part having arbitrary shapes may be used. Additionally, the angle between the vertical part and the horizontal part is not limited to 90 degrees.

The horizontal part 136*b* is mounted along the direction X arranged in a portion in which the lamps 130 are arranged as shown in FIG. 15. The length of the horizontal part 136*b* may be equal to or less than a distance (for example, interval E) between the lamps 130 at opposite ends which distance is determined by an outermost circle P and arbitrary positions (for example, indicated by D) of the lamps in the direction Y as shown in FIG. 15. If the length is equal to the above-mentioned distance, a single lamp 130A is mounted in the lamp mounting position. If the length is less than the above-mentioned distance, a plurality of lamps 130A are mounted in the lamp mounting position. The horizontal parts 136*b* of the lamps 130A mounted in different lamp positions may be the same or different from each other.

The horizontal part 137*b* is concentrically arranged with the circles shown in FIG. 15. The dashed circle shown in FIG. 27 is concentric with the circles shown in FIG. 15. The length of the horizontal part 137*b* is determined by a length of a circle which is concentric with the circles shown in FIG. 15 and a number of lamps 130B are arranged along the circle. The radii of the horizontal parts 137*b* of the lamps 130B arranged along different concentric circles differ from each other.

In FIGS. 26 and 27, the plated parts 149A and 149B are removed from the respective lamps 130A and 130B for the sake of convenience. However, in practice, as shown in FIG. 28, portions of the light-emitting parts 136 and 137, which portions face the wafer W, are covered by the plated parts 149A and 149B. The plated part 149A is provided on entire side surfaces of the vertical parts 136*a* and an upper half portion of the horizontal part 136*b*. The plated part 149B is provided on entire side surfaces of the vertical parts 137*a* and an upper half portion of the horizontal part 137*b*.

Similar to the plated part 149, the plated parts 149A and 149B have a function to reflect the heat radiation light of the respective lamps 130A and 130B at a high reflectance within the respective light-emitting parts 136 and 137. By providing the light-emitting parts 136 and 137 having a high reflectance, the directivity of the light-emitting parts 136 and 137 (radiation light emitted by the filaments 135A and 135B) to the wafer W is improved. As a result, the plated parts 149A and 149B exclude the reflector (reflective plate), which is conventionally provided outside the light-emitting part. Since the reflector is not used, the plurality of lamps 130 can be mounted at a high density. For example, the lamps can be arranged can be mounted at a lamp density which is four times the lamp density of the arrangement having a reflector inclined by 45 degrees. Accordingly, the power density can be increased and, therefore, the heat treatment apparatus is suitable for RTP.

Figure 31:
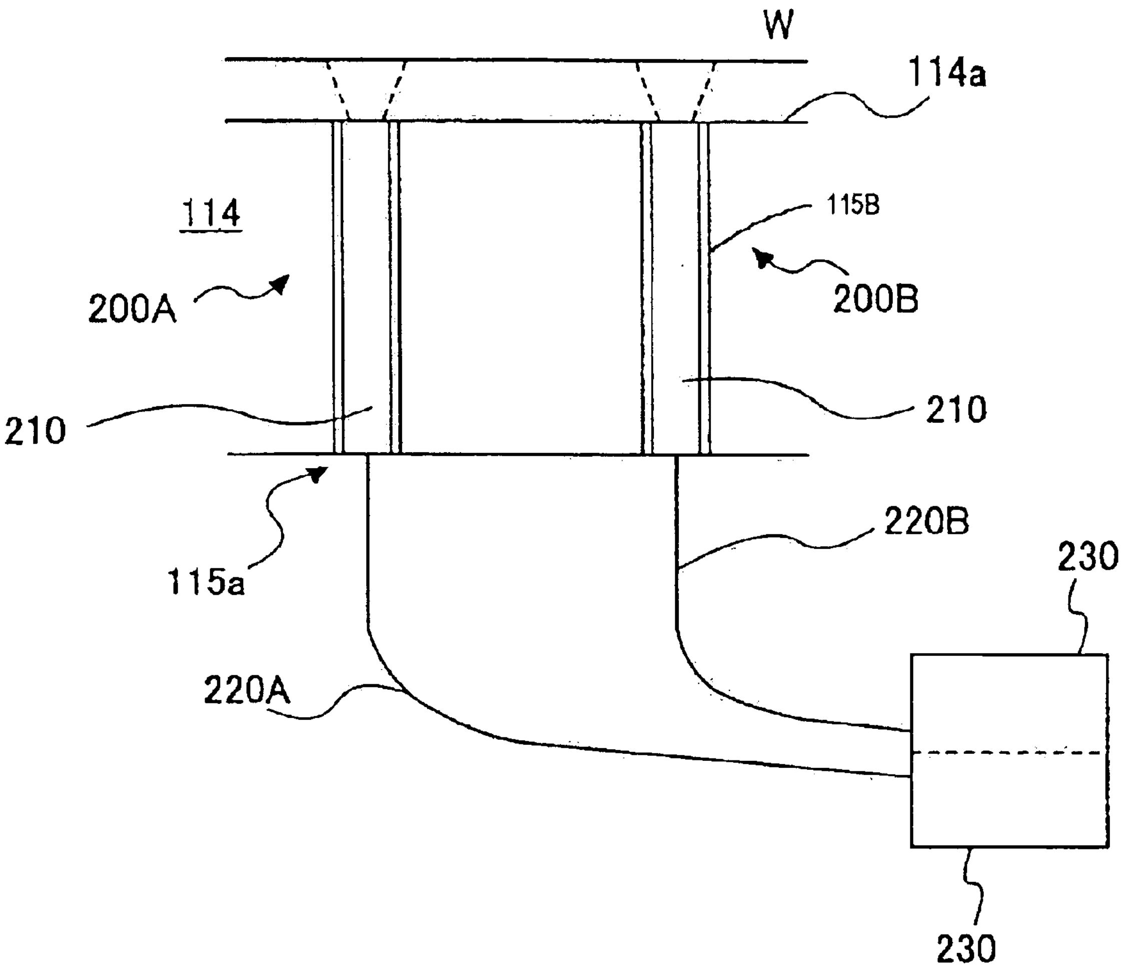
FIG. 31 is a cross-sectional view showing two kinds of radiation thermometers.
Figure 32:
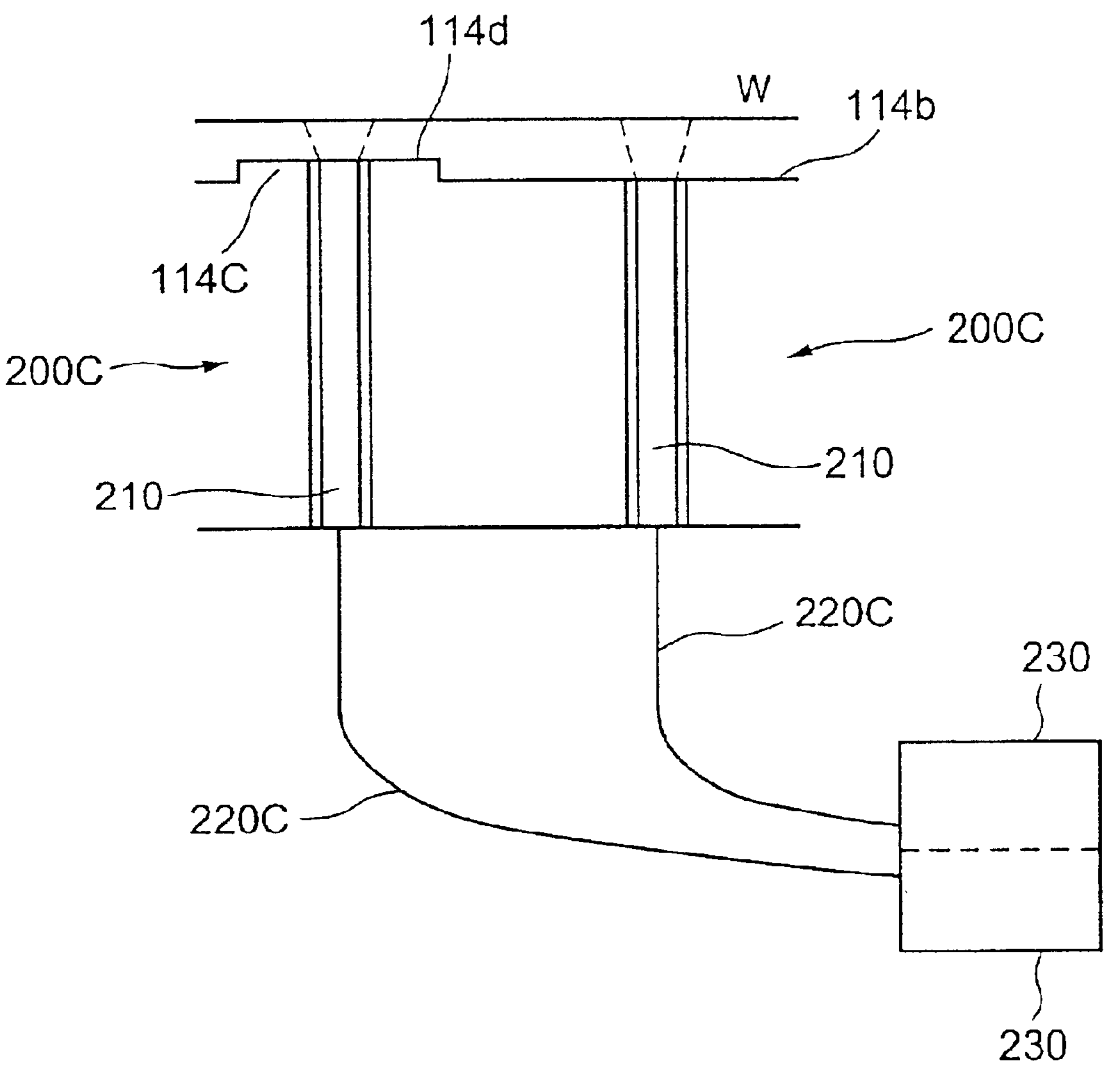
FIG. 32 is a cross-sectional view showing two radiation thermometers of the same kind.
Figure 33:
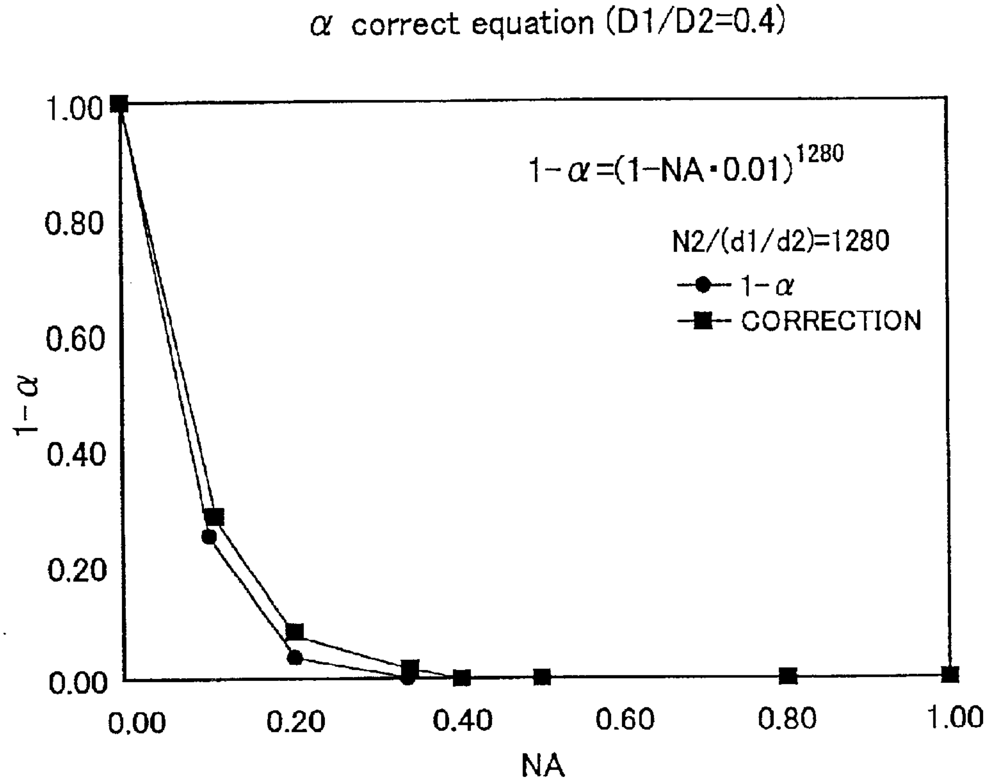
FIG. 33 is a graph for explaining a method of calculating an effective emissivity according to the present invention.
Figure 34:
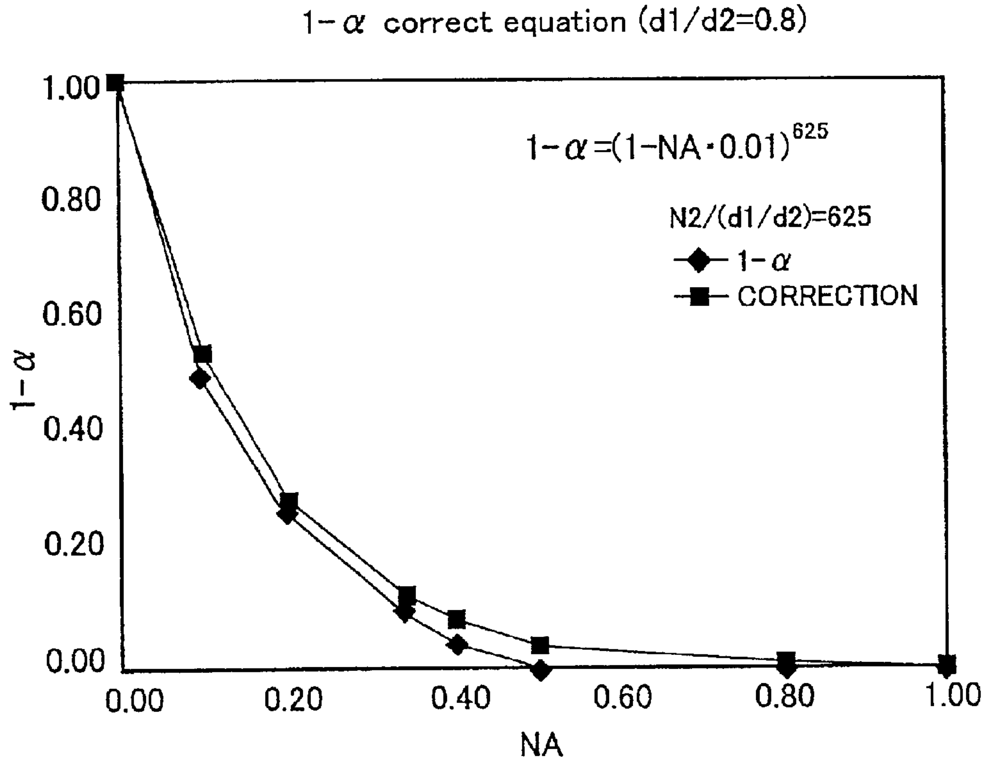
FIG. 34 is a graph for explaining a method of calculating an effective emissivity according to the present invention.
Figure 35:
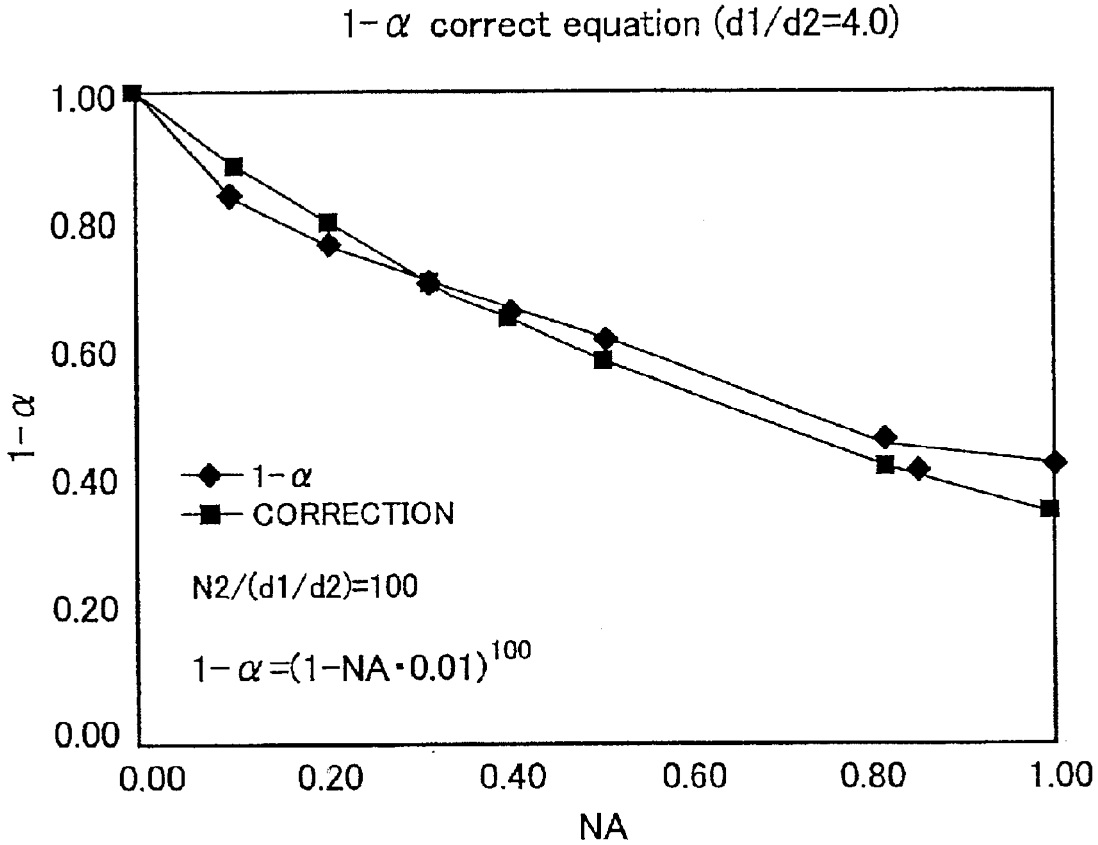
FIG. 35 is a graph for explaining a method of calculating an effective emissivity according to the present invention.

A description will now be given, with reference to FIGS. 31 through 35, of a method of calculating an effective emissivity which is another aspect of the present invention. FIG. 31 is a cross-sectional view showing two kinds of radiation thermometers 200A and 200B. FIG. 32 is a cross-sectional view showing two radiation thermometers 200C of the same kind. FIGS. 33 through 35 are graphs for explaining the method of calculating an effective emissivity according to the present invention. Hereinafter, the radiation thermometers 200A, 200B and 200C may be simply referred to as radiation thermometer 200.

The radiation thermometers 200A, 200B and 200C are provided on the opposite side of the lamps 130 with respect to the wafer W. Although the present invention does not exclude the structure in which the radiation thermometers 200A, 200B and 200C is provided on the same side with the lamps 130, it is preferable that the radiation light of the lamps 130 is prevented from being incident on the radiation thermometers 200A, 200B and 200C.

Each of the radiation thermometers 200A, 200B and 200C shown in FIGS. 31 and 32 comprises a quartz or sapphire rod 210, respective optical fibers 220A, 220B and 220C, and a photodetector (PD) 230. Since the radiation thermometers 200A, 200B and 200C according to the present invention do not use a chopper, a motor for rotating the chopper, an LED and a temperature adjusting arrangement for achieving a stable light emission of the LED, the radiation thermometers 200A, 200B and 200C have a relatively inexpensive structure.

Referring to FIG. 31, the radiation thermometers 200A and 200B are mounted on a bottom part 114 of the process chamber 110. More specifically, the radiation thermometers 200A and 200B are inserted into respective cylindrical through holes 115A and 115B of the bottom part 114. A surface 114*a* of the bottom part 114 facing the interior of the process chamber 110 serves as a reflective plate (high-reflectance surface) by being subjected to a sufficient polishing. This is because if the surface 114*a* is a low reflectance surface such as a black surface, the surface 114*a* absorbs heat of the wafer W, which results in an undesired increase in the output of the lamps 130.

Each of the radiation thermometers 200A and 200B comprises the same rod 210 (210A and 210B), respective optical fibers 220A and 220B having different aperture numbers (N/A) and a photodetector (PD) 230. The rod 210 is formed of a quartz rod having a diameter off 4 mm. Although quartz and sapphire can be used since they have a food heat resistance and a good optical characteristic, the material of the rod 210 is not limited to quarts or sapphire. If necessary, the rod 210 can protrude inside the process chamber 110 by a predetermined length. The rod 210 of each of the radiation thermometers 200A and 200B is inserted into respective through holes 115A and 115B provided in the bottom part 114 of the process chamber 110, and is sealed by an O-ring (not shown in the figure). Accordingly, a negative pressure environment can be maintained in the process chamber irrespective of the through holes 115A and 115B. The rod 210 has an excellent light collecting efficiency since the rod 210 can guide a radiation light, which is incident on the rod 210, to the respective optical fibers 210A and 210B with less attenuation and less leakage. The rod 210 receives a radiation light from the wafer W, and guides received radiation light to the PD 230 via the respective optical fibers 220A and 220B.

Each of the optical fibers 220A and 220B comprises a core which transmits a light and a concentric clad which covers the core. The core and the clad are made of a transparent dielectric material such as glass or plastic. The refractive index of the clad is slightly smaller than that of the core, thereby achieving a total reflection. Thus, the core can propagate a light without leaking outside. In order to achieve different NA, the radiation thermometers 200A and 200B use a core and clad of different materials.

The photodiode (PD) 230 has an image forming lens, a silicon (Si) photocell and an amplification circuit so as to convert the radiation light incident on the image forming lens into a voltage, which is an electric signal representing radiation intensities $E_1(T)$ and $E_2(T)$, and send the electric signal to the control part 300. The control part 300 comprises a CPU, an MPU, other processors, and memories such as a RAM and a ROM so as to calculate an emissivity $\epsilon$ and a substrate temperature T of the wafer W based on the radiation intensities $E_1(T)$ and $E_2(T)$. It should be noted that the calculation may be performed by an arithmetic part (not shown in the figure) provided in the radiation thermometers 200A, 200B and 200C. The radiation light received by the rod 210 is introduced into the photodetector (PD) 230 via the optical fibers 220A and 220B.

A description will now be given of a method of calculating an effective emissivity according to the present invention which uses different NA. Considering multiple reflection between the wafer W and the rod 210 and a direct light from the lamps 130, the effective emissivity $\epsilon_{eff}$ of the wafer W can be given by the following equation (2).

$$\epsilon_{eff}=(1-\alpha)\times\epsilon+\alpha\times\epsilon/[1-F\times r\times(1-\epsilon)] \quad (2)$$

where, $\epsilon_{eff}$ represents an effective emissivity of the wafer W; $\epsilon$ represents an emissivity of the wafer W; r represents a reflectance of the surface 114*a* of the bottom part 114 of the process chamber 110; F is a view factor given by the following equation (3); $\alpha$ is a coefficient of multiple reflection.

$$F=(1+\cos 2\gamma)/2 \quad (3)$$

The coefficient of multiple reflection $\alpha$ is supposed to take the following values depending on three values which are 1) a diameter D1 of the rod 210, 2) a distance D2 between the wafer W and the surface 114*a* and 3) number of aperture NA of the radiation thermometers 200A and 200B. It should be noted that $\gamma$ represents a view angle determined by a positional relationship between the rod 210, the surface 114*a* and the wafer W as shown in FIG. 47B.

$$NA=0\rightarrow(1-\alpha)=1 \quad (4)$$

$$NA=1\rightarrow(1-\alpha)\approx1 \quad (5)$$

$$D1/D2=\infty\rightarrow(1-\alpha)=1 \quad (6)$$

$$D1/D2=0\rightarrow(1-\alpha)=1 \quad (7)$$

A prediction equation which can establish the above-mentioned four conditions can be defined as the following equation (8).

$$(1-\alpha)=(1-NA\times N1)^{N2/(D1/D2)} \quad (8)$$

where N1 and N2 are the parameters in the equation (8). Accordingly, the coefficient of multiple reflection $\alpha$ is represented by the following equation (9).

$$\alpha=1-(1-NA\times N1)^{N2/(D1/D2)} \quad (9)$$

It can be appreciated that the coefficient of multiple reflection $\alpha$ represented by the equation (9) possibly satisfies the equations (4) through (7). Thus, the adequacy of equation (9) is considered by determining N1 and N2 based on equation (9).

First, a calculation is made by fixing the diameter (4 mm) of the rod 210 and varying NA. It is assumed that the wafer W has $\epsilon$=0.2 for the sake of saving time. At this time, NA ranges from 0 to 1. Values of N1 and N2/(D1/D2) are tentatively determined by comparing data obtained by the calculation and the assumption of equation (9). In a similar manner, values of N1 and N2/(D1/D2) are determined for the diameters of 2 mm and 20 mm. As for a method of determining N1 and N2, N2 and N2/(D1/D2)–D1/D2 curve are used. N1 is selected so that N2 is common to the three conditions in N2/(D1/D2).

According to the tentative values of N1 and N2/(D1/D2) determined by the above-mentioned method, relationships between (1-$\alpha$) and NA are known. As a result, N1=0.01 and N2=500 are obtained, and equation (9) can be represented by the following equation (10).

$$\alpha=1-(1-0.01\times NA)^{500/(D1/D2)} \quad (10)$$

Accordingly, if the diameter of the rod 210 is changed, or if the distance between the wafer W and the surface 114*a* is changed, the effective emissivity can be easily calculated irrespective of the value of NA.

In a case in which the optical fiber 220A has NA=0.2 and the optical fiber 220B has NA=0.34, the coefficients of multiple reflection $\alpha_{0.2}$ and $\alpha_{0.34}$ can be represented by the following equations (11) and (12).

$$\alpha_{0.2}=1-(1-0.01\times0.2)^{500/(D1/D2)} \quad (11)$$

$$\alpha_{0.34}=1-(1-0.01\times0.34)^{500/(D1/D2)} \quad (12)$$

Accordingly, the effective emissivity of the wafer W can be given by the following equations (13) and (14).

$$\epsilon eff_{0.2}=(1-\alpha_{0.2})\times\epsilon+\alpha_{0.2}\times\epsilon/[1-F\times r\times(1-\epsilon)] \quad (13)$$

$$\epsilon eff_{0.34}=(1-\alpha_{0.34})\times\epsilon+\alpha_{0.34}\times\epsilon/[1-F\times r\times(1-\epsilon)] \quad (14)$$

Figure 36A:
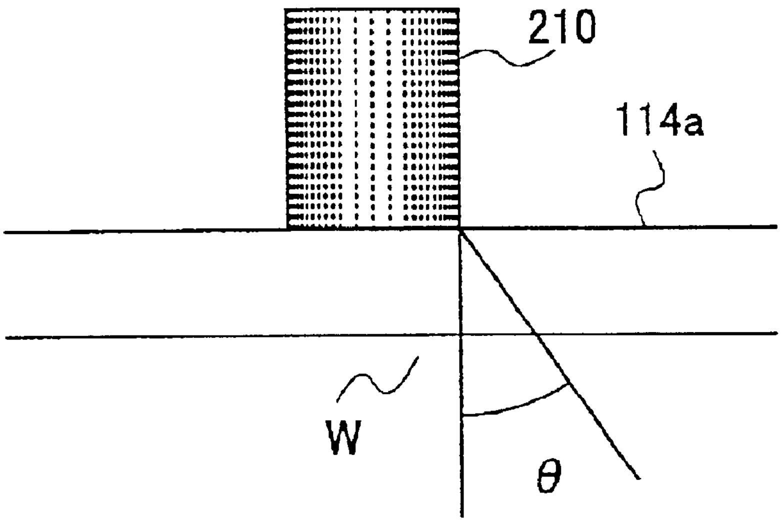
FIG. 36A is an illustration showing an incident angle θ of a radiation light to an optical fiber.
Figure 36B:
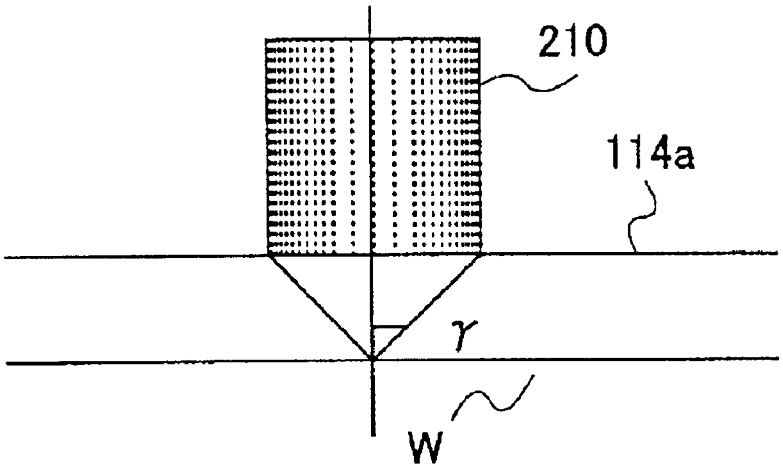
FIG. 36B is an illustration showing a view angle γof a rod.

The radiation thermometer 200 performs the conversion of temperature based on radiation light flux (W). Thus, a difference in the incident light fluxes at the two radiation thermometers are given by the following equations (15) and (16), where θ1 is an incident angle at NA=0.2 and θ2 is an incident angle at NA=0.34. The incident angle θ represents a maximum light-receiving angle of an optical fiber as shown in FIG. 36A, and the incident angle θ can be represented as $\theta=\sin^{-1}(NA)$.

$$E_{0.2}=A_{ROD}\times(r\times\tan\theta1)^2\times\pi\times L/r^2 \quad (15)$$

$$E_{0.34}=A_{ROD}\times(r\times\tan\theta2)^2\times\pi\times L/r^2 \quad (16)$$

Accordingly, the ratio of the incident light fluxes of the two radiation thermometers 200A and 200B can be represented by the following equation (17)

$$(\varepsilon eff_{0.34}\times E_{0.34})/(\varepsilon eff_{0.2}\times E_{0.2})=(\varepsilon eff_{0.34}\times\tan^2\theta2)/(\varepsilon eff_{0.2}\times\tan^2\theta1) \quad (17)$$

According to the above-mentioned equations (13) and (14), equation (17) can be changed into the following equation (18).

$$(\varepsilon eff_{0.34} \times E_{0.34})/(\varepsilon eff_{0.2} \times E_{0.2}) = \{(1-\alpha_{0.34})\times\varepsilon + \alpha_{0.34}\times\varepsilon/[1-F\times r\times(1-\varepsilon)]\}\times \tan^2\theta 2/\{(1-\alpha_{0.2})\times\varepsilon+\alpha_{0.2}\times\varepsilon/[1-F\times r\times(1-\varepsilon)]\} \quad (18)$$

Then, if β is defined as in the following equation (19), the above-mentioned equation (18) can be changed into the following equations (20) through (24).

$$\beta = [(\varepsilon eff_{0.34}\times E_{0.34})/(\varepsilon eff_{0.2}\times E_{0.2})]\times[(\varepsilon eff_{0.34}\times\tan^2\theta 2)/(\varepsilon eff_{0.2}\times\tan^2\theta 1)] \quad (19)$$

$$\beta\times\{(1-\alpha_{0.2})\times\varepsilon+\alpha_{0.2}\times\varepsilon/[1-F\times r\times(1-\varepsilon)]\} = \{(1-\alpha_{0.34})\times\varepsilon+\alpha_{0.34}\times\varepsilon/[1-F\times r\times(1-\varepsilon)]\} \quad (20)$$

$$\beta\times\{(1-\alpha_{0.2})\times[1-F\times r\times(1-\varepsilon)]+\alpha_{0.2}\} = \{(1-\alpha_{0.34})\times[1-F\times r\times(1-\varepsilon)]+\alpha_{0.34}\} \quad (21)$$

$$\beta\times(1-\alpha_{0.2})-\beta\times[1-\alpha_{0.2})\times[F\times r\times(1-\varepsilon)]+\beta\times\alpha_{0.2} = (1-\alpha_{0.34})-(1-\alpha_{0.34})\times[F\times r\times(1-\varepsilon)]+\alpha_{0.34} \quad (22)$$

$$\beta\times(1-\alpha_{0.2})-\beta\times[1-\alpha_{0.2})\times F\times r+\beta\times(1-\alpha_{0.2})\times F\times r\times\varepsilon-(1-\alpha_{0.34}) = -(1-\alpha_{0.34})\times F\times r+F\times r\times(1-\alpha_{0.34})\times\varepsilon+\alpha_{0.34} \quad (23)$$

$$\beta\times(1-\alpha_{0.2})-\beta\times(1-\alpha_{0.2})\times F\times r+\beta\times\alpha_{0.2}-(1-\alpha_{0.34})+(1-\alpha_{0.34})\times F\times r-\alpha_{0.34} = (1-\alpha_{0.34})\times F\times r\times\varepsilon-\beta\times(1-\alpha_{0.2})\times F\times r\times\varepsilon \quad (24)$$

Accordingly, the emissivity $\epsilon$ of the wafer W can be calculated by the following equation (25).

$$\varepsilon = \{\beta\times(1-\alpha_{0.2})-\beta\times(1-\alpha_{0.2})\times F\times r+\beta\times\alpha_{0.2}-(1-\alpha_{0.34})+(1-\alpha_{0.34})\times F\times r-\alpha_{0.34}\}/\{(1-\alpha_{0.34})\times F\times r-\beta\times(1-\alpha_{0.2})\times F\times r\} \quad (25)$$

Then, the effective emissivity is calculated again by the equations (11) and (12). At this time, the calculation is performed based on the small value of NA, that is, NA=2. The following equation (26) can be obtained by entering the emissivity $\epsilon$, which was calculated by equation (23), in equation (11).

$$\epsilon eff_{0.2}=(1-\alpha_{0.2})\times\epsilon+\alpha_{0.2}\times\epsilon/[1-F\times r\times(1-\epsilon)] \quad (26)$$

Since radiation energy of $E_{0.2}$ is incident on the radiation thermometer 200A of NA=0.2, the following equation (27) is established, where $E_b$ is radiation energy according to black body radiation.

$$E_{0.2}=\epsilon eff_{0.2}\times E_b \quad (27)$$

Then, the above-mentioned equation (25) is changed as follows.

$$E_b=E_{0.2}/\epsilon eff_{0.2} \quad (28)$$

Regarding incident energy, the following relationship is defined by Japanese Industrial Standard (JIS 1612), where T represents a temperature of the wafer W; c2 represents a second constant of radiation (0.014388 m/k); A, B and C are constants peculiar to the radiation thermometer 200 (determined by calibration); Eb is radiation energy from a black body (normally an output V of a radiation thermometer).

$$T=c\mathbf{2}/A/(lnC-lnE_b)-B/A \quad (29)$$

The above-mentioned calculation method obtains an emissivity of the wafer W by the two radiation thermometers 200A and 200B having different NAs, the emissivity can be obtained based on the above-mentioned equation (9) by changing a ratio of D1/D2. FIG. 32 is an illustration for explaining such a method.

In FIG. 32, a bottom surface 114*b* corresponding to the bottom surface 114*a* and an upper surface 114*d* of a protruding part 114*c* protruding form the bottom surface 114*b* are provided in the bottom part 114 of the process chamber 110. Accordingly, identical radiation thermometers 200C are used, but distances between the wafer W and the quartz rod 210 of each of the radiation thermometers 200C are different. Thus, in the example shown in FIG. 32, an emissivity of the wafer W can be obtained similar to the example shown in FIG. 29.

For example, in FIG. 32, the two radiation thermometers 200C have NA=0.2, and the distance between the wafer W and the rod 210 of one of the radiation thermometers 200C is set to 3.5 mm (left side of FIG. 32) and the distance between the wafer W and the rod 210 of the other radiation thermometer 200C is set to 5 mm (right side of FIG. 32). Additionally, the diameter of the rod 210 is set to 4 mm. According to equation (9), each coefficient of multiple reflection can be represented by the following equations (30) and (31).

$$\alpha_{3.5}=1-(1-0.001\times0.2)^{500/(D1/3.5)} \quad (30)$$

$$\alpha_{5.0}=1-(1-0.001\times0.2)^{500/(D1/5.0)} \quad (31)$$

Using the above equations (30) and (31), the effective emissivities $\alpha_{3.5}$ and $\alpha_{5.0}$ are obtained in the similar manner as equations (13) and (14). The subsequent calculation of obtaining the temperature of the wafer W is performed in the same manner as that explained with reference to equations (15) through (28) by replacing the suffix 0.2 by 3.5 and 0.34 by 5.0.

The detector 270 and the control part 300 can calculate the temperature T of the wafer W based on equations (25) through (29). In any case, the control part 300 can obtain the temperature T of the wafer W. Additionally, a temperature measurement calculation program including the above-mentioned equations is stored in a computer readable medium such as a floppy disk, or the program is distributed through a communication network such as the Internet or the like.

The control part 300 has a CPU and a memory incorporated therein. The control part 300 feedback-controls the output of the lamps 130 by recognizing the temperature T of the wafer W and controlling the lamp driver 310. Additionally, the control part 300 controls a rotational speed of the wafer W by sending a drive signal to the motor driver 320 at a predetermined timing.

The gas introducing part 180 includes a gas source, a flow adjust valve, a mass-flow controller, a gas supply nozzle and a gas supply passage interconnecting the aforementioned (not shown in the figure) so as to introduce a gas used for heat treatment into the process chamber 110. It should be noted that although the gas introducing part 180 is provided to the sidewall 112 of the process chamber 110 so as to introduce the gas into the process chamber from the side, the position of the as introducing part 180 is not limited to the side of the process chamber. For example, the gas introducing part 180 may be constituted as a showerhead which introduces the process gas from an upper portion of the process chamber 110.

If the process to be performed in the process chamber 110 is an annealing process, the process gas includes $N_2$, Ar, etc.; if the process is an oxidation process, the process gas includes $O_2$, $H_2$, $H_2O$, $NO_2$, etc.; if the process is a nitriding process, the process gas includes $N_2$, $NH_3$, etc.; if the process is a film deposition process, the process gas includes $NH_3$, $SiH_2$, $Cl_2$, $SiH_4$, etc. It should be noted that the process gas is not limited the above-mentioned gasses.

The mass-flow controller is provided for controlling a flow of the process gas. The mass-flow controller comprises a bridge circuit, an amplification circuit, a comparator control circuit, a follow adjust valve, etc. so as to control the flow adjust valve by measuring a gas flow by detecting an amount of heat transmitted from the upstream side to the downstream side in association with the gas flow. The gas supply passage uses a seamless pipe and a bite-type coupling or a metal gasket coupling so as to prevent impurities from entering the gas to be supplied. Additionally, the supply pipe is made of a corrosion resistant material so as to generation of dust particles due to dirt or corrosion on an inner surface of the supply pipe. The inner surface of the supply pipe may be coated by an insulating material such as PTFE (Teflon), PFA, polyimide, PBI, etc. Additionally, the inner surface of the supply pipe may be subjected to an electropolishing. Further, a dust particle filter may be provided to the gas supply passage.

In the present embodiment, although the exhaust part 190 is provided parallel to the gas introducing part 180, the position and the number are not limited to that shown in the figure. The exhaust part 190 is connected to a desired exhaust pump, such as a turbomolecular pump, a sputter ion pump, a getter pump, a sorption pump, a cryostat pump, together with a pressure adjust valve. It should be noted that although process chamber is maintained at a negative pressure environment in the present embodiment, such a structure is not an essential feature of the present invention. That is, for example, the process chamber may be maintained at a pressure ranging from 133 Pa to an atmospheric pressure. The exhaust part 190 has a function to exhaust helium gas before starting a subsequent heat treatment.

Figure 37:
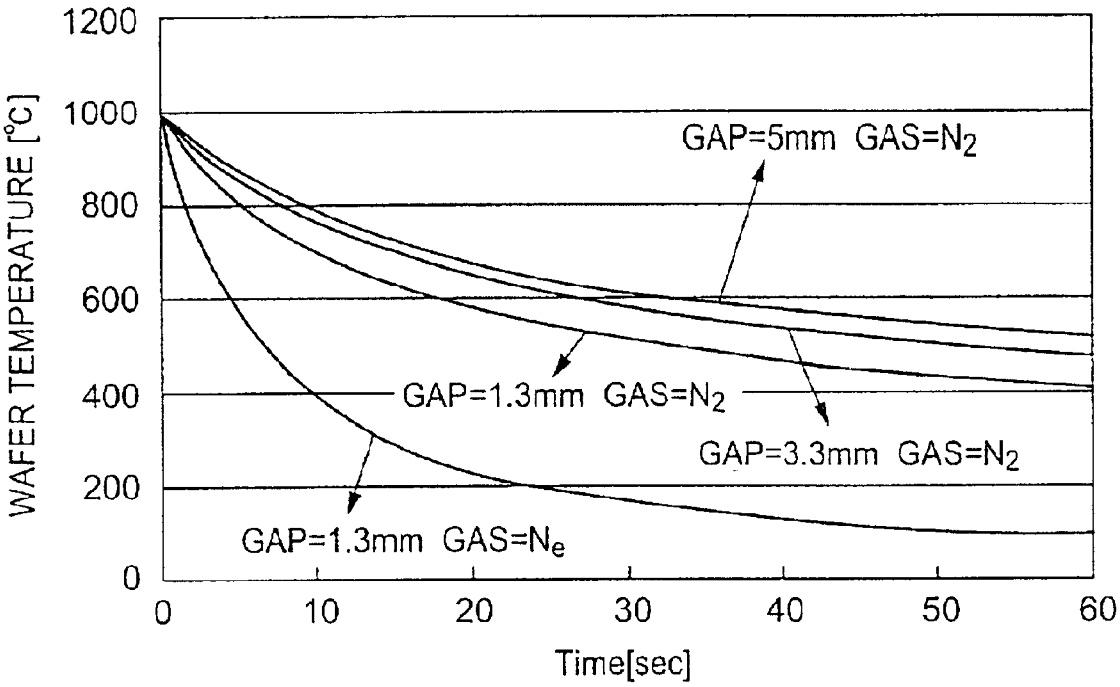
FIG. 37 is a graph showing a result of simulation with respect to a cooling rate of the wafer.

FIG. 37 is a graph showing a result of simulation with respect to a cooling rate of the wafer W. In FIG. 37, a gap represents a distance between the wafer W and the bottom part 114. It can be appreciated from FIG. 37 that 1) a cooling rate increases as the gap decreases, and 2) the cooling rate remarkably increases by flowing helium gas, which has a high heat conductivity, between the wafer W and the bottom part 114.

In the structure of the RTP apparatus 100 shown in FIG. 2, the upper surface of the wafer W is heated by the lamps 130, and the bottom part 114 is provided as a cooling plate on the back side of the wafer W. Accordingly, the structure shown in FIG. 2 gives a high cooling rate, but needs a relatively large power so as to perform a rapid temperature rise since an amount of heat released from the wafer W is increased. In order to solve such a problem, supply of cooling water to the cooling pipe 116 may be stopped when heating the wafer. However, such a method is not preferable since a yield rate is decreased.

Figure 38:
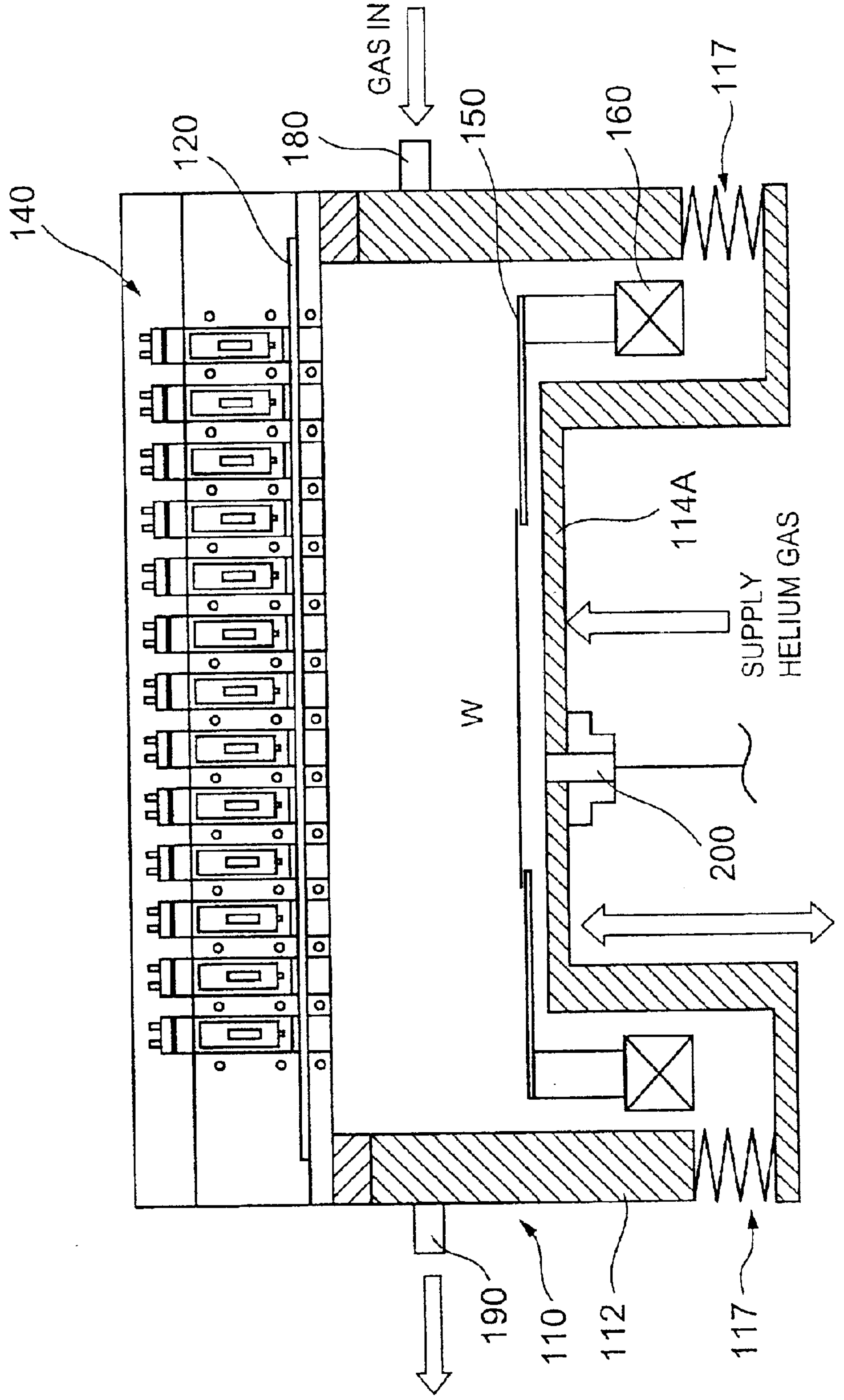
FIG. 38 is a cross-sectional view of the heat treatment apparatus shown in FIG. 2, which is provided with a variation of a bottom part.
Figure 39:
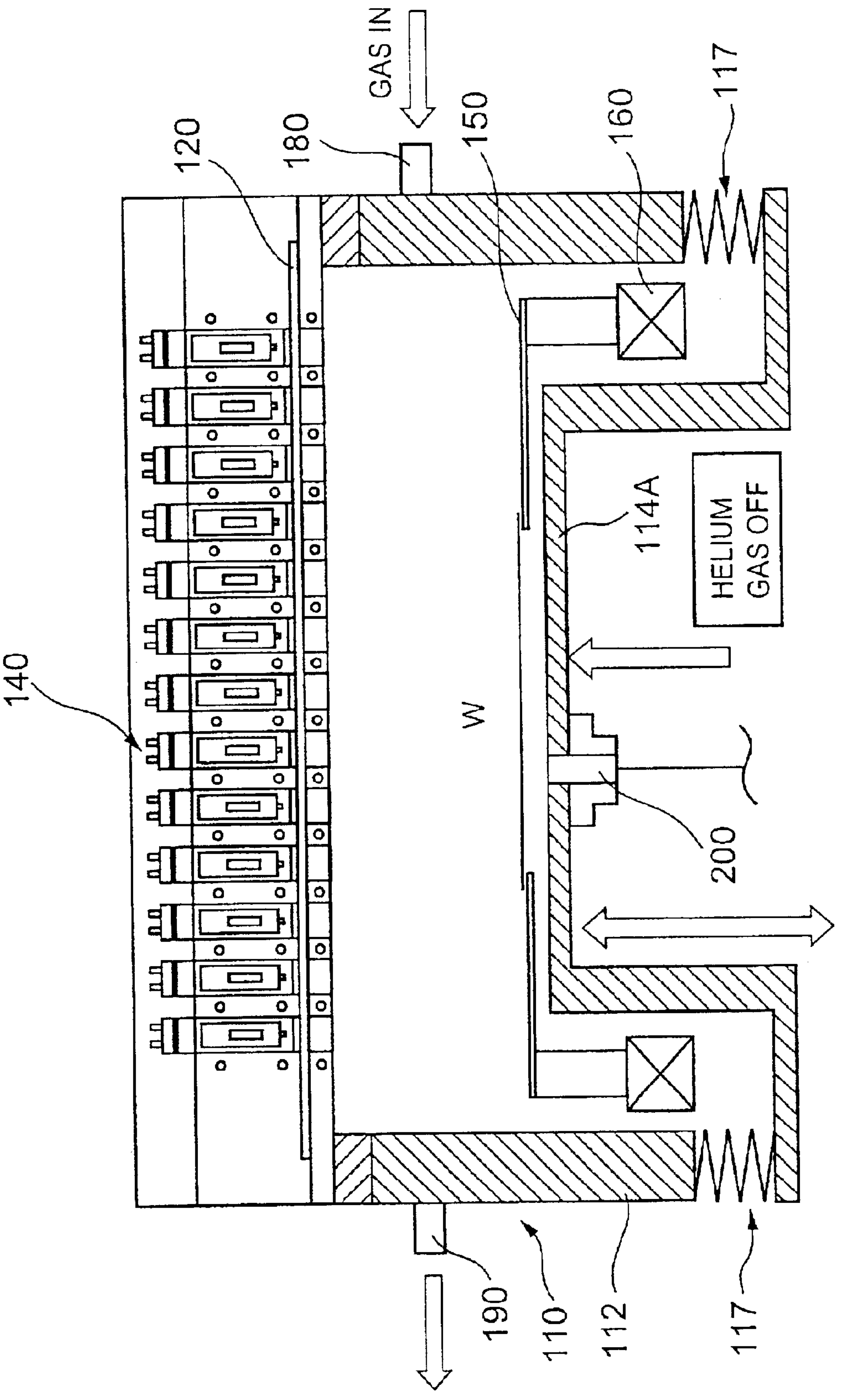
FIG. 39 is a cross-sectional view of the heat treatment apparatus shown in FIG. 38 in a state in which the wafer is being heated.
Figure 40:
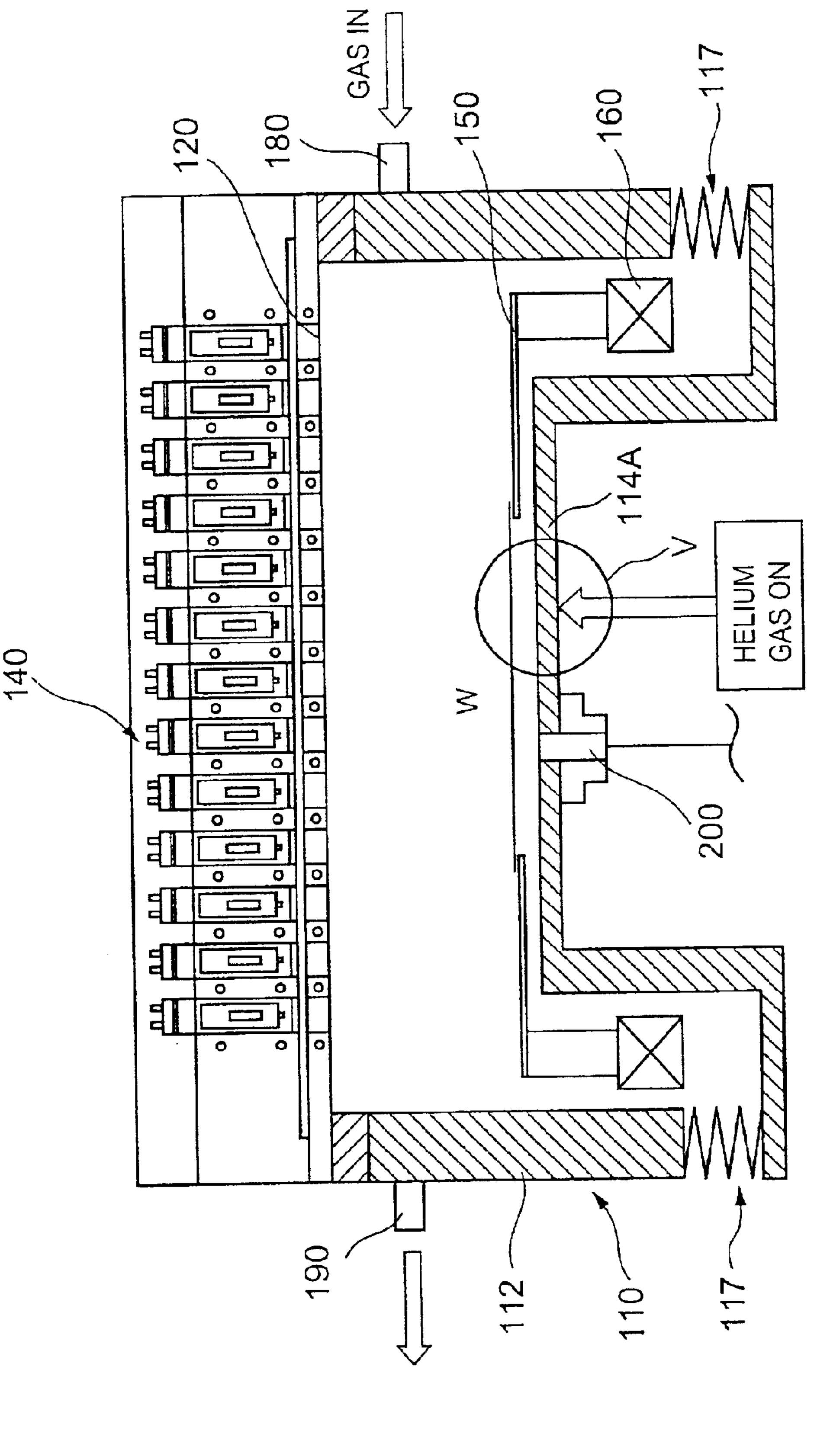
FIG. 40 is a cross-sectional view of the heat treatment apparatus shown in FIG. 38 in a state in which the wafer is being cooled.

Accordingly, as shown in FIGS. 38 through 40, the bottom part 114 as a cooling plate may be replaced by a bottom part 114A which is arranged movable relative to the wafer W. More preferably, helium gas, which has a high heat conductivity, is supplied between the wafer W and the bottom part 114A when cooling the wafer W so as to increase a radiation efficiency. FIG. 38 is a cross-sectional view of the heat treatment apparatus 100 having the bottom plate 114A. FIG. 39 is a cross-sectional view of the heat treatment apparatus 100 in a state in which the wafer W is being heated. FIG. 40 is a cross-sectional view of the heat treatment apparatus 100 in a state in which the wafer W is being cooled. The cooling pipe 116 and the control part 300 connected to the radiation thermometer 200 are not shown in the drawings.

As shown in FIG. 38, the bottom part 114A is movable up and down with respect to the wafer W (object to processed) by a vertical moving mechanism 117 which is controlled by the control part 300. The vertical moving mechanism 117 includes a bellows so as to maintain the negative pressure environment in the process chamber 110. The vertical moving mechanism 117 can be constituted by a known mechanism in the art, and a detailed description thereof will be omitted. It should be noted that the wafer W or the support ring 150 may be arranged to be movable relative to the bottom part 114A. When heating the wafer W, the bottom part 114A is moved downward so as to separate the bottom plate 114A from the wafer W as shown in FIG. 39, and supply of helium gas is stopped. At this time, a distance between the wafer W and the bottom part 114A is 10 mm, for example. Since the distance between the bottom part 114A and the wafer W is large, the wafer is not influenced by the bottom part 114A, thereby achieving a rapid temperature rise of the wafer W. The position of the bottom part 114A shown in FIG. 39 may be set as a home position.

Figure 41:
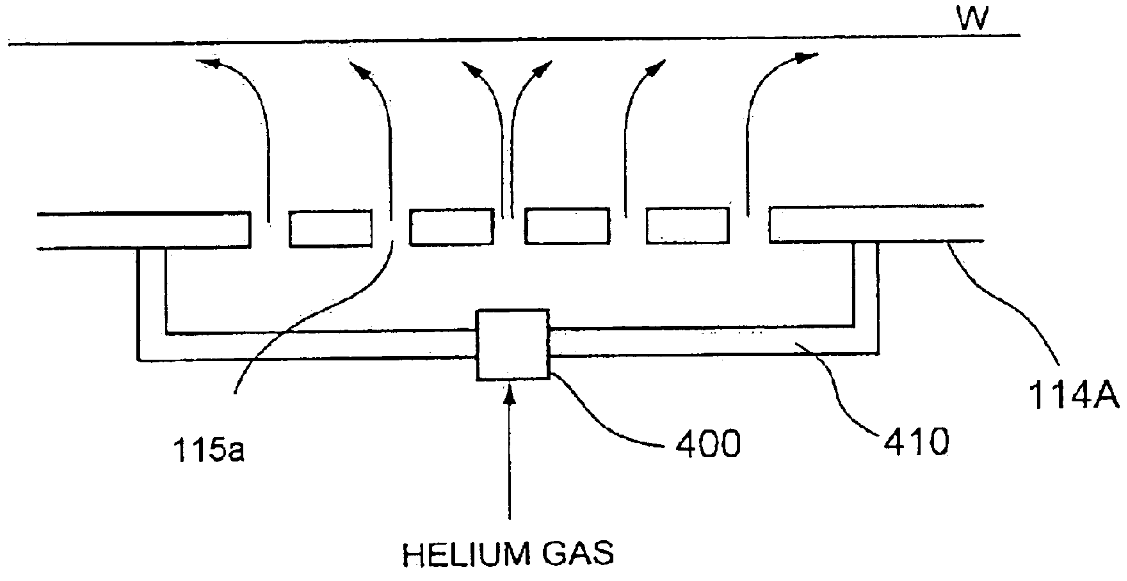
FIG. 41 is a cross-sectional view of a helium gas supply part.

When cooing the wafer W, the bottom part 114A is moved upward so as to approach the bottom part 114A to the wafer W, and the supply of helium gas is started. Since the distance between the wafer W and the bottom part 114A is small, the wafer W is influenced by the bottom plate 114A, thereby achieving a high-rate cooling. At this time, the distance between the wafer W and the bottom part 114A is 1 mm, for example. FIG. 41 is an enlarged cross-sectional view of a helium gas supply part provided in an area V shown in FIG. 40. As shown in FIG. 41, the bottom part 114A is provided with a lot of small holes **114*a* through which helium gas is introduced into the process chamber 110. A case 410 is connected to the bottom part 114A, and a helium gas supply pipe is connected to the case 410 via a valve 400**, which operates to start or stop the supply of helium gas.

In the present embodiment, although a relative movement is performed between the bottom part (cooling plate) 114A and the wafer W, the present invention is applicable to a relative movement of the wafer W and the lamps 130.

A description will now be given, with reference to FIG. 2, of a rotating mechanism of the wafer W. In order to maintain a good electric characteristic of each element in an integrated circuit and a high yield rate of products, a uniform heat treatment is required over the entirety of the surface of the wafer W. If a temperature distribution on the surface of the wafer W is uneven, the RTP apparatus 100 cannot provide a high-quality heat treatment since a thickness of a film produced by a film deposition process may vary and a slip may be generated in the wafer W due to a thermal stress.

The uneven temperature distribution on the surface of the wafer W may be caused by an uneven irradiance distribution or may be caused by a process gas, which is supplied near the gas introducing part 180, absorbing heat from the surface of the wafer W. The rotating mechanism rotates the wafer W, which enables a uniform heating by the lamps 130 over the entire surface of the wafer W.

The rotating mechanism of the wafer W comprises the support ring 150, the permanent magnet 170, a ring-like magnetic member 172, a motor driver 320 and a motor 330.

The support ring 150 has a ring shape and is made of a heat resistant ceramic such as SiC. The support ring 150 serves as a placement stage on which the wafer W is placed. The support ring 150 supports a periphery of the backside of the wafer W. If necessary, the support ring 150 may be provided with an electrostatic chuck or a clamp mechanism so as to fix the wafer to the support ring 150. The support ring 150 is configured and arranged to prevent heat form being released from an outer edge of the wafer W so that the uniform heating of the wafer W is not deteriorated.

The support ring 150 is connected to the support part 152 at outer end thereof. If necessary, a heat insulating member formed on quartz glass is interposed between the support ring 150 and the support part 152 so as to thermally protect the magnetic member 172. In the present embodiment, the support part 152 is formed as an opaque quartz member having a hollow cylindrical shape. The bearing 160 is fixed to the support part 152 and the inner wall of process chamber 110 so as to allow a rotation of the support part 152 while maintaining the negative pressure environment of the process chamber 110. The magnetic member 172 is attached to the lower end of the support part 152.

The ring-like permanent magnet 170 and magnetic member 172, which are concentrically arranged, are magnetically coupled with each other, and the permanent magnet 170 is rotated by the motor 330. The motor 330 is driven by the motor driver 320, which is controlled by the control part 300.

Consequently, when the permanent magnet 170 rotates, the magnetically coupled magnetic member 172 is rotated together with the support part 152, which results in rotation of the support ring and the wafer W. Although the rotation speed in the present embodiment is 90 r.p.m., the rotation speed may be determined based on a material and size of the wafer W (object to be processed) and a type and temperature of the process gas so that there is less effect of turbulence of gas within the process chamber 110 and stream of gas due to the rotation of the wafer W. The permanent magnet 170 and the magnetic member 172 may be reversed as long as they are magnetically coupled, or the magnetic member 172 may also be formed of a permanent magnet.

A description will now be given of an operation of the RTP apparatus 100. First, the wafer W is carried in the process chamber 110 through a gate valve (not shown in the figure) by a conveyance arm of a cluster tool (not shown in the figure). When the conveyance arm supporting the wafer W reaches above the support ring 150, a lifter pin vertically moving system moves lifter pins (for example, three lifter pins) upward so as to protrude the lifter pins from the support ring 150 to support the wafer W. As a result, the wafer is transferred from the conveyance arm to the lifter pins, and, then, the conveyance arm returns out of the process chamber 110 through the gate valve. Thereafter, the gate valve is closed. The conveyance arm may return to a home position (not shown in the figure).

The lifter vertically moving mechanism retract the lifter pins below the surface of the support ring 150, thereby placing the wafer W on the support ring 150. The lifter pin vertically moving mechanism may use a bellows so as to maintain the a negative pressure environment in the process chamber and prevent the atmosphere inside the process chamber from flowing out of the process chamber 110 during the vertically moving operation.

Thereafter, the controller controls the lamp driver 310 so as to send an instruction to drive the lamps 130. In response to the instruction, the lamp driver 310 drives the lamps 130 so that the lamps 130 heat the wafer W at a temperature of about 800° C. The heat treatment apparatus 100 according to the present embodiment improves the directivity of the lamps 130 by the action of the lens assemblies 122 and the plated part 149 while removing the reflector, and, thereby, increasing the lamp density and consequently the power density. Thus, a desired high rate temperature rise of the wafer W can be achieved. A heat ray (radiation light) emitted by the lamps 130 is irradiated onto the surface of the wafer W by passing through the quartz window 120 so as to heat the wafer W at 800° C. with a heating rate of about 200° C./sec.

Generally, a periphery of the wafer W tends to release a greater amount of heat than the center portion thereof. However, the present embodiment can provide a high directivity and temperature control capability since the lamps 130 according to the present invention are concentrically so as to enable a power control for each area. If the apparatus 100 uses the structure shown in FIG. 32, the bottom part 114A is located at the home position as shown in FIG. 39. Especially, the structure shown in FIG. 39 can provide an efficient rapid temperature rise since the wafer W hardly receives influence from the bottom part 114*a* due to a large distance between the wafer W and the bottom part 114A as a cooling plate. The exhaust part 190 forms a negative pressure environment in the process chamber 110 at or around the time of heating the wafer W.

At the same time the control part 300 controls the motor driver 320 to send an instruction to drive the motor 330. In response to the instruction, the motor driver 320 drives the motor 330 so as to rotate the ring-like magnet 170. As a result, the support part 152 (or 152A) rotates, and the wafer W rates together with the support ring 150. Since the wafer W rotates, the temperature within the surface of the wafer W is maintained uniform during the heat treatment process.

The quartz window 120 has a relatively small thickness due to the action of the lens assemblies 122, the reinforcing members 124 and the waveguiding members 126, which provides the following advantages with respect to the heating process of the wafer W.

1) The irradiation efficiency to the wafer W is not deteriorated since the quartz window 120 having the reduced thickness absorbs less heat.

2) A thermal stress fracture hardly occurs since the temperature difference between the front and back surfaces of the quartz plate 121 of the quartz window 120 is small.

3) In a case of a film deposition process, a deposition film and byproduct are hardly formed on the surface of the quarts window 120 since a temperature rise in the surface of the quartz window 120 is small.

4) A pressure difference between the negative pressure in the process chamber 110 and the atmospheric pressure can be maintained even if the thickness of the quartz plate 121 is small since the mechanical strength of the quartz plate 121 is increased by the lens assemblies 122.

The temperature of the wafer W is measured by the radiation thermometer 200, and the control part 300 feedback-controls the lamp driver 310 based on the result of measurement. Since the wafer W is rotated, the temperature distribution on the surface of the wafer W is supposed to be uniform. However, if necessary, the radiation thermometer 200 may measure a temperature at a plurality of points on the surface of the wafer W so that the control part 300 sends an instruction to change the output of the lamps with respect to a specific area of the wafer W when the result of measurement of the radiation thermometer 200 indicates that the temperature distribution on the surface of the wafer W is not uniform. Since the controllability of irradiation of heat is improved by the plated part 149 and the lens assemblies 122, a desired part of the wafer W can be accurately heated with a desired degree.

The radiation thermometer 200 has a simple structure in which a chopper and an LED is not used, the radiation thermometer is inexpensive, which contributes to miniaturization and economization of the heat treatment apparatus 100. Additionally, the temperature measured by the method of calculating effective emissivity is accurate. An electric characteristic of an integrated circuit formed in the wafer W is deteriorated due to diffusion of impurities when the wafer W is placed under a high-temperature environment for a long time. Accordingly, a rapid heating and a rapid cooling are required, which also requires a temperature control of the wafer W. The method of calculating effective emissivity according to the preset invention satisfies such requirements. Thus, the RTP apparatus 100 can provide a high-quality heat treatment.

After the wafer W is heated at the desired temperature, a process gas is introduced into the process chamber 110 through the gas introducing part (not shown in the figure). After the heat treatment is completed, the controller 300 controls the lamp driver 310 so as to stop the heating by the lamps 130. Then, the lamp driver stops to supply a power to the lamps 130. If the apparatus 100 uses the structure shown in FIG. 32, the controller 300 controls the vertical moving mechanism 117 so move the bottom part 114A to a cooling position. Additionally, helium gas having a high heat conductivity is supplied between the wafer W and the bottom part 114A as shown in FIG. 37. Thereby, the cooling efficiency to the wafer W is increased, and a rapid cooling can be achieved with a relatively small power consumption. The cooling rate achieved by the apparatus 100 is about 200° C./sec.

After the heat treatment, the wafer W is carried out of the process chamber 110 by the conveyance arm of the cluster tool through the gate valve in the reverse sequence. Thereafter, if necessary, the conveyance arm conveys the wafer W to a next stage apparatus such as a film deposition apparatus.

The present invention is not limited to the specifically disclosed embodiments, and variations and modifications may be made without departing from the scope of the present invention.

The present application is based on Japanese priority application No. 2000-324214 filed on Oct. 24, 2000, the entire contents of which are herein incorporated by reference.

What is claimed is:

1. A lamp for use as a heat source of a heat treatment apparatus for applying a heat treatment to an object to be processed, the lamp comprising:

at least one electrode part to which an electric power is supplied;

a transparent envelope connected to said electrode part, the transparent envelope sealing a filament for emitting a light; and a high-reflectance film formed on an outer surface of a first part of said transparent envelope so that said high-reflectance film reflects the light emitted from said filament and the reflected light exits from said transparent envelope through a second part of said transparent envelope other than said first part on which said high-reflectance film is formed so as to improve a directivity of the light exiting from said second part of said transparent envelope, wherein said electrode part is connected to one end of said transparent envelope having an elongated tubular shape so as to form a single end lamp, and said first part of said transparent envelope extends in a longitudinal direction of said transparent envelope, and wherein said transparent envelope has a straight cylindrical shape having a closed one end as a bottom surface, and said high-reflectance film is formed on an entire outer surface of said transparent envelope other than said bottom surface.

2. The lamp as claimed in claim 1, wherein an outer surface of said first part of said transparent envelope has unevenness so that said high-reflectance film is formed on the outer surface having the unevenness.

3. The lamp as claimed in claim 1, wherein said high-reflectance film is formed by gold plating.

4. The lamp as claimed in claim 3, wherein a thickness of said high-reflectance film is about 10 $\mu$m.

5. A heat treatment apparatus having a process chamber in which a heat treatment is applied to an object to be processed and a plurality of lamps as a heat source for heating said object to be processed, wherein each of said lamps comprises:

at least one electrode part to which electric power is supplied;

a transparent envelope connected to said electrode part, the transparent envelope sealing a filament for emitting a light;

a high-reflectance film formed on an outer surface of a first part of said transparent envelope so that said high-reflectance film reflects the light emitted from said filament and the reflected light exits from said transparent envelope through a second part of said transparent envelope other than said first part on which said high-reflectance film is formed so as to improve a directivity of the light exiting from said second part of said transparent envelope; and a cooling part for maintaining said first part of said transparent envelope at a temperature not exceeding 500° C., wherein the cooling part cools the first part having the high-reflectance film by air cooling so that the first part is cooled to a temperature not exceeding 500° C., wherein the heat treatment apparatus has a lamp density greater than 0.04 lamps/$cm^2$.

6. The heat treatment apparatus as claimed in claim 5, wherein said high-reflectance film is formed of a gold plated film.

7. The heat treatment apparatus as claimed in claim 5, wherein the lamp density is greater than 0.16 lamps/$cm^2$.

8. A heat treatment apparatus as claimed in claim 5, wherein at least one of said lamps is a single-ended lamp.

* * * * *